US012614667B2

(12) United States Patent
Park

(10) Patent No.: US 12,614,667 B2
(45) Date of Patent: Apr. 28, 2026

(54) CAPACITOR WIRE HAVING POROUS STRUCTURE IN DIELECTRIC LINE AND ELECTRONIC DEVICE INCLUDING THE SAME

(71) Applicant: Samsung Electronics Co., Ltd., Suwon-si (KR)

(72) Inventor: Soojae Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 596 days.

(21) Appl. No.: 18/111,617

(22) Filed: Feb. 20, 2023

(65) Prior Publication Data

US 2024/0006122 A1     Jan. 4, 2024

(30) Foreign Application Priority Data

Jun. 30, 2022     (KR) ........................ 10-2022-0080651

(51) Int. Cl.
| | |
|---|---|
| *H01G 2/06* | (2006.01) |
| *H10D 1/68* | (2025.01) |
| *H10W 90/00* | (2026.01) |
| *H10W 72/00* | (2026.01) |

(52) U.S. Cl.
CPC ............. *H01G 2/065* (2013.01); *H10D 1/692* (2025.01); *H10W 90/701* (2026.01); *H10W 72/884* (2026.01); *H10W 90/724* (2026.01); *H10W 90/736* (2026.01); *H10W 90/756* (2026.01)

(58) Field of Classification Search
CPC .. H01G 2/065; H10D 1/692; H01L 23/49816; H01L 24/16; H01L 24/32; H01L 24/48; H01L 24/73
See application file for complete search history.

(56) References Cited

U.S. PATENT DOCUMENTS

| | | | |
|---|---|---|---|
| 7,906,803 | B2 | 3/2011 | Shioya et al. |
| 10,629,520 | B2 | 4/2020 | Haga |
| 10,756,161 | B2 | 8/2020 | Balasubramanian et al. |
| 2001/0050837 | A1* | 12/2001 | Stevenson ............ A61N 1/3754 |
| | | | 29/25.42 |

(Continued)

FOREIGN PATENT DOCUMENTS

| | | |
|---|---|---|
| JP | H06-21135 A | 1/1994 |
| JP | 2531361 B2 | 9/1996 |

(Continued)

OTHER PUBLICATIONS

Fan et. al., "Assembly of gold nanoparticles into aluminum nanobowl array," Scientific Reports, May 24, 2017, pp. 1-7.

(Continued)

*Primary Examiner* — Michael Jung
(74) *Attorney, Agent, or Firm* — Muir Patent Law, PLLC

(57) ABSTRACT

Disclosed are capacitor wires and electronic devices including the same. The capacitor wire comprises a core electrode line having a wire shape extending in a length direction, an outer electrode line that covers at least a portion of the core electrode line and extends in the length direction of the core electrode line, and a dielectric line between the core electrode line and the outer electrode line and extending in the length direction of the core electrode line. The dielectric line has a porous structure including a plurality of holes.

20 Claims, 27 Drawing Sheets

(56) References Cited

U.S. PATENT DOCUMENTS

| | | | |
|---|---|---|---|
| 2008/0124547 A1 | 5/2008 | O et al. | |
| 2008/0318470 A1* | 12/2008 | Morikawa | H01R 13/6625 |
| | | | 439/578 |
| 2011/0019335 A1* | 1/2011 | Wu | H01G 4/005 |
| | | | 361/303 |
| 2012/0197368 A1* | 8/2012 | Reisinger | H01R 13/5224 |
| | | | 607/116 |
| 2022/0149068 A1* | 5/2022 | Liu | H10D 64/037 |
| 2023/0245828 A1 | 8/2023 | Park | |

FOREIGN PATENT DOCUMENTS

| | | |
|---|---|---|
| KR | 1020230116281 A | 8/2023 |
| KR | 1020230135849 A | 9/2023 |
| KR | 1020230139713 A | 10/2023 |

OTHER PUBLICATIONS

Huang et. al., "The toolbox of porous anodic aluminum oxide-based nanocomposites: from preparation to application," Colloid and Polymer Science, 2021, pp. 325-341.
Liu et. al., "Fabrication and application of nanoporous anodic aluminum oxide: A review," Nanotechnology, IOP Publishing, Mar. 10, 2021.
Saber Amin Yavari et al., Additively manufactured porous titanium with nanotubular surfaces containing anti-microbial agents, https://www.frontiersin.org/10.3389/conf.FBIOE.2016.01.02141/event_abstract.

* cited by examiner

FIG. 2
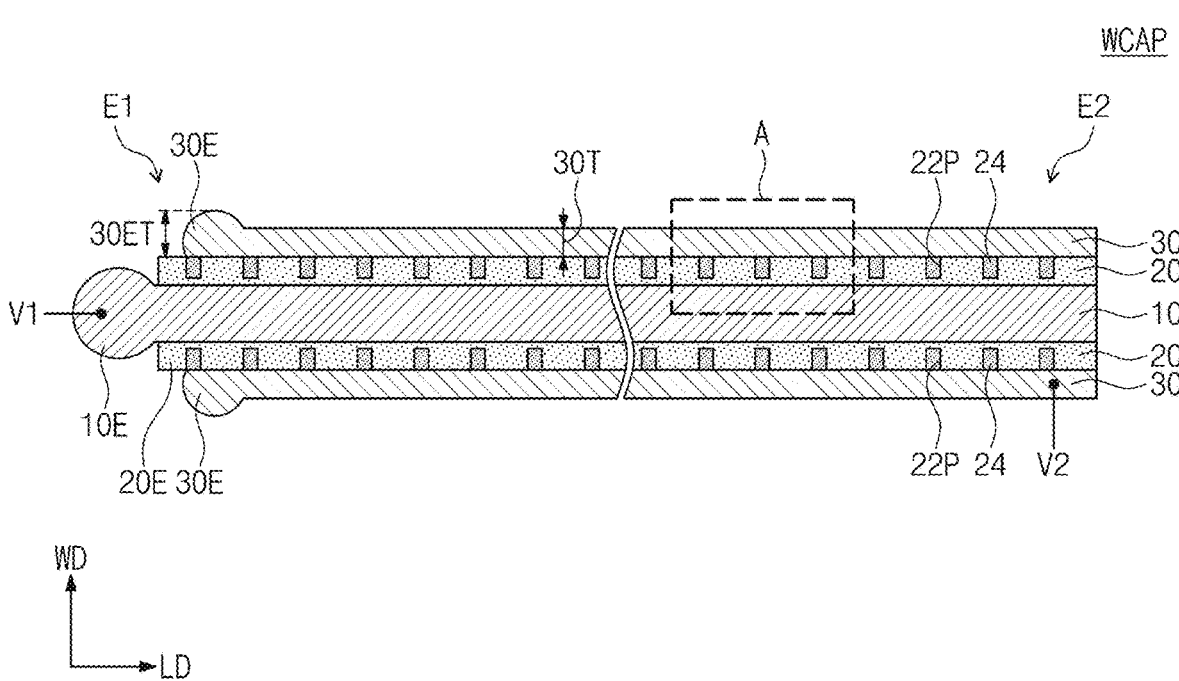
FIG. 3A
FIG. 3B
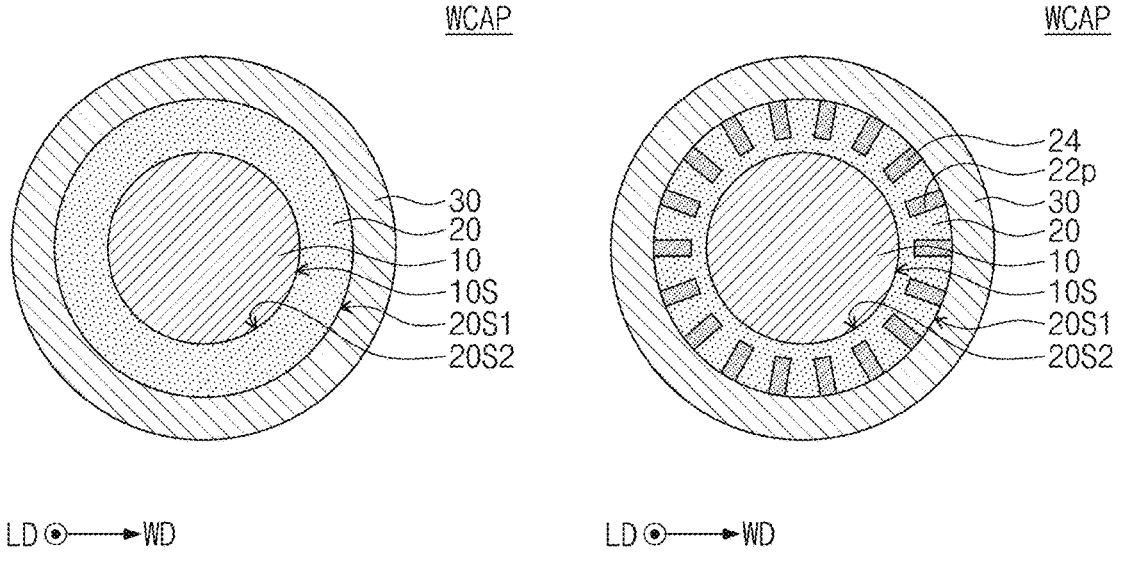

CAPACITOR WIRE HAVING POROUS STRUCTURE IN DIELECTRIC LINE AND ELECTRONIC DEVICE INCLUDING THE SAME

CROSS-REFERENCE TO RELATED APPLICATION

This U.S. nonprovisional application claims priority under 35 U.S.C § 119 to Korean Patent Application No. 10-2022-0080651 filed on Jun. 30, 2022 in the Korean Intellectual Property Office, the disclosure of which is hereby incorporated by reference in its entirety.

BACKGROUND

The present disclosure relates to a capacitor wire and an electronic device including the same.

A multi-layer ceramic capacitor (MLCC) widely used for various electronic devices has advantages, such as compactness and high capacitance, and a soldering method is employed to mount the multi-layer ceramic capacitor on a substrate. For example, the multi-layer ceramic capacitor may be mounted on a substrate of an electronic device such as a display device, a computer, and a smart phone, and may be used as a chip-shaped condenser that serves to charge or discharge electricity in the electronic device. In accordance with the trend of compactness of electronic devices, it is important for multi-layer ceramic capacitor to become smaller in size. However, a limitation on fabrication and mounting of the multi-layer ceramic capacitor may cause restriction of compactness of the multi-layer ceramic capacitor.

SUMMARY

Some embodiments of the present inventive concepts provide a capacitor wire capable of easily achieving a compact size and increased capacitance and an electronic device including the same.

Some embodiments of the present inventive concepts provide a capacitor wire capable of being easily mounted and highly integrated on a substrate and an electronic device including the same.

According to some embodiments of the present inventive concepts, a capacitor wire may comprise: a core electrode line having a wire shape and extending in a length direction; an outer electrode line that covers at least a portion of the core electrode line and extends in the length direction of the core electrode line; and a dielectric line between the core electrode line and the outer electrode line, the dielectric line extending in the length direction of the core electrode line. The dielectric line may have a porous structure including a plurality of holes.

According to some embodiments of the present inventive concepts, a capacitor wire includes an innermost electrode line having a wire shape and extending in a length direction; an outermost electrode line that surrounds at least a portion of the innermost electrode line and extends in the length direction of the innermost electrode line; and a dielectric line between the innermost electrode line and the outermost electrode line, the dielectric line extending in the length direction of the innermost electrode line, wherein the dielectric line has a porous structure including a plurality of holes According to some embodiments of the present inventive concepts, an electronic device may comprise: a substrate; and a capacitor wire electrically connected to the substrate.

The capacitor wire may include: a core electrode line having a wire shape and extending in a length direction; an outer electrode line that covers at least a portion of the core electrode line and extends in the length direction of the core electrode line; and a dielectric line between the core electrode line and the outer electrode line, the dielectric line extending in the length direction of the core electrode line. The dielectric line may have a porous structure including a plurality of holes. The capacitor wire may be wire-bonded to the substrate.

BRIEF DESCRIPTION OF THE DRAWINGS

FIG. 2 illustrates a cross-sectional view taken along line A-A' of FIG. 1.

FIGS. 3A and 3B illustrate a cross-sectional view taken along line B-B' and line C-C' respectively of FIG. 1.

FIGS. 11 to 15 illustrate cross-sectional views taken along line A-A' of FIG. 1, showing a method of fabricating a capacitor wire according to some embodiments of the present inventive concepts.

DETAIL PARTED DESCRIPTION OF EMBODIMENTS

The following will now describe in detail some embodiments of the present inventive concepts with reference to the accompanying drawings.

Figure 1:
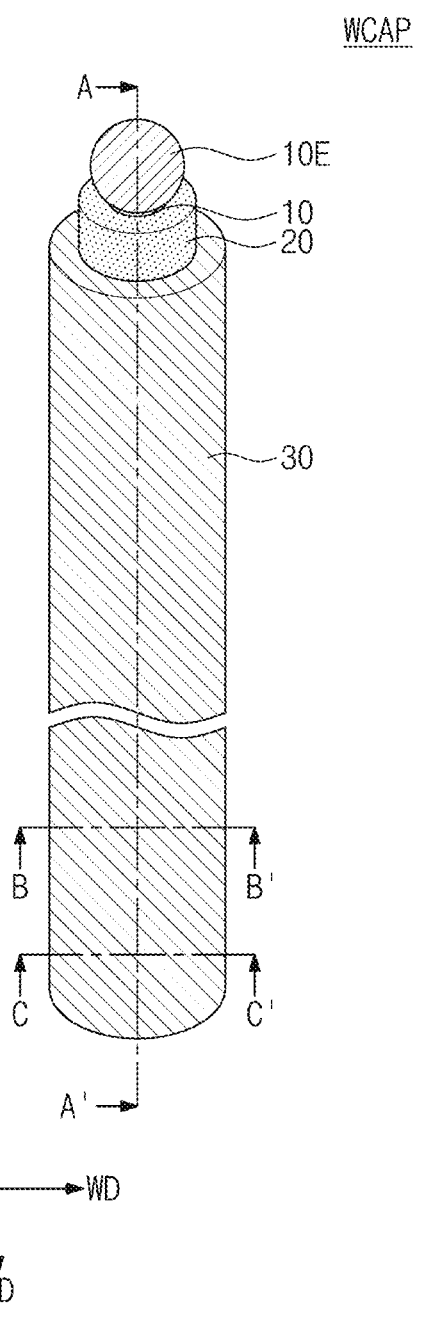
FIG. 1 illustrates a simplified perspective view showing a capacitor wire according to some embodiments of the present inventive concepts.
Figures 4, 5:
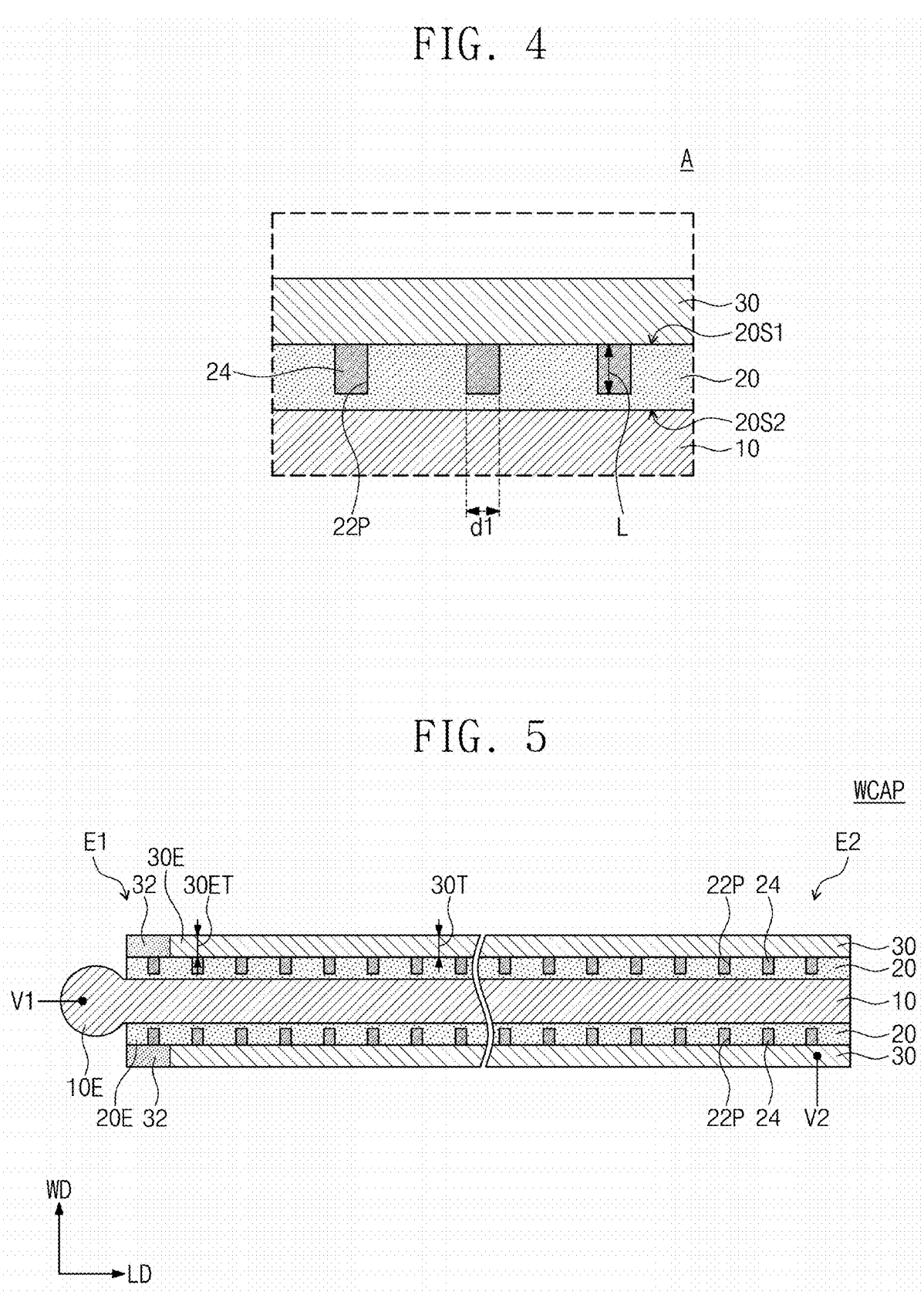
FIG. 4 illustrates an enlarged view showing section A of FIG. 2.
FIGS. 5 and 6 illustrate cross-sectional views taken along line A-A' of FIG. 1, showing a capacitor wire according to some embodiments of the present inventive concepts.

FIG. 1 illustrates a simplified perspective view showing a capacitor wire according to some embodiments of the present inventive concepts. FIG. 2 illustrates a cross-sectional view taken along line A-A' of FIG. 1. FIGS. 3A-3B illustrate a cross-sectional view taken along lines B-B' and C-C' of FIG. 1, respectively. FIG. 4 illustrates an enlarged view showing section A of FIG. 2.

Referring to FIGS. 1, 2, and 3A and 3B, a capacitor wire WCAP may include a core electrode line 10, an outer electrode line 30 that covers at least a portion of the core electrode line 10, and a dielectric line 20 interposed between the core electrode line and the outer electrode line 30.

The core electrode line 10 may have a wire shape and may extend in one direction. The extending direction of the core electrode line 10 may be called a length direction LD, and a direction orthogonal to the length direction LD may be called a width direction WD. The core electrode line 10 may have a rounded shape (e.g., circular shape) at a cross section in the width direction WD. According to some embodiments, differently from that shown in FIGS. 3A and 3B, the core electrode line 10 may have a polygonal shape (e.g., rectangular shape), or other shapes, at a cross section in the width direction WD. The core electrode line 10 may include or be formed of a first metal, which first metal may include at least one selected from Au, Ag, Pd, Cu, and Al. The core electrode line 10 may extend along a central axis of the capacitor wire and may have a solid structure passing through the central axis.

The dielectric line 20 may cover at least a portion of core electrode line and may extend in the length direction LD between the core electrode line 10 and the outer electrode line 30. The dielectric line 20 may cover and may contact an outer surface of the core electrode line 10, and may extend in the length direction LD along the outer surface 10S of the core electrode line 10. It will be understood that when an element is referred to as being "connected" or "coupled" to or "on" another element, or as "covering" another element, it can be directly connected or coupled to or on or covering the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. Other words used to describe the relationship between elements should be interpreted in a like fashion (e.g., "between" versus "directly between," "adjacent" versus "directly adjacent," etc.).

Referring to FIGS. 2 to 4, the dielectric line 20 may have a porous structure having a plurality of holes 22P. The dielectric line 20 may have a first surface 20S1 adjacent to the outer electrode line 30 and a second surface 20S2 adjacent to the core electrode line 10. The first surface 20S1 of the dielectric line 20 may be called an outer surface of the dielectric line 20, and the second surface 20S2 of the dielectric line 20 may be called an inner surface of the dielectric line 20. The second surface 20S2 of the dielectric line 20 may surround and contact the outer surface 10S of the core electrode line 10. Each of the plurality of holes 22P may extend into the dielectric line 20 from the first surface 20S1 toward the second surface 20S2.

Each of the plurality of holes 22P may have a diameter d1 (e.g., in the length direction LD) ranging from about 5 nm to about 900 nm, for example, from about 6 nm to about 400 nm. The plurality of holes 22P may have a density equal to or less than about $10^{11}$ ea/cm$^2$, and may each have a length L (also described as a depth) equal to or less than about 100 lam. Each of the plurality of holes 22P may extend partly into the dielectric line 20 from the outer surface 20S1 of the dielectric line 20, but not all of the way through the dielectric line. Each of the plurality of holes may therefore have an approximately cylindrical shape. As shown in FIG. 2, a plurality of holes 22P may be formed in rows in the length direction LD. As shown in FIG. 3B, a plurality of holes 22P may be formed along a circumference of the dielectric line 20. Therefore, an array of holes 22P may be formed in the dielectric line 20. The holes may be formed in an evenly distributed manner, or may be formed to be unevenly, or randomly distributed. Also, not all holes need to have the same shape or size.

The capacitor wire WCAP may further include dielectric patterns 24 that fill the plurality of holes 22P. The dielectric patterns 24 may include or be a dielectric material different from that of the dielectric line 20. The dielectric line 20 may include or be formed of a first dielectric material, and the dielectric patterns 24 may include or be formed of a second dielectric material whose permittivity is greater than that of the first dielectric material. The second dielectric material may have a dielectric constant greater than that of the first dielectric material. The first dielectric material may include or may be metal oxide, such as at least one selected from aluminum oxide, titanium oxide, niobium oxide, yttrium oxide, tantalum oxide, cobalt oxide, zirconium oxide, barium oxide, hafnium oxide, barium titanate, manganese oxide, ruthenium oxide, and manganese carbonate, or may include or be multi-component oxide containing elements included in the oxide mentioned above. The second dielectric material may include or be a material, whose dielectric constant is greater than that of the first dielectric material, such as at least one selected from aluminum oxide, titanium oxide, niobium oxide, yttrium oxide, tantalum oxide, cobalt oxide, zirconium oxide, barium oxide, hafnium oxide, barium titanate, manganese oxide, ruthenium oxide, and manganese carbonate, or may include or be multi-component oxide containing elements included in the oxide mentioned above.

Referring back to FIGS. 1, 2, and 3A-3B, the outer electrode line 30 may extend in the length direction LD while covering the dielectric line 20 and the dielectric patterns 24. The outer electrode line 30 may surround and contact the first surface 20S1 (or outer surface) of the dielectric line 20, and may extend in the length direction LD along the first surface 20S1 (or outer surface) of the dielectric line 20. The outer electrode line 30 may include an inner surface that contacts the first surface 20S1 of the dielectric line 20 and that contacts end surfaces of the dielectric patterns 24. The dielectric line 20 and the dielectric patterns 24 may be disposed between the core electrode line 10 and the outer electrode line 30, and may electrically separate (or isolate) the outer electrode line from the core electrode line 10.

The capacitor wire WCAP may have a first end E1 and a second end E2 that are opposite to each other in the length direction LD of the core electrode line 10. According to some embodiments, at the first end E1 of the capacitor wire WCAP, the outer electrode line 30 may expose an end of at least one selected from the core electrode line 10 and the dielectric line 20. For example, on the first end E1 of the capacitor wire WCAP, the outer electrode line 30 may expose an end 20E of the dielectric line 20 (e.g., end surfaces and side surfaces of the dielectric line 20 at the end 20E of the dielectric line may be exposed), and the end 20E of the dielectric line 20 may expose an end 10E of the core electrode line 10 (e.g., end and side surfaces of the core electrode line 10 at the end 10E of the core electrode line 10 may be exposed). For example, the end 20E of the dielectric line 20 may protrude (in the length direction LD) from an end surface of the outer electrode line 30, and the end 10E of the core electrode line 10 may protrude (in the length direction LD) from an end surface of both the outer electrode line and the dielectric line 20. According to some embodiments, the core electrode line 10 may have a spherical (or ball) shape at the end 10E thereof.

The outer electrode line 30 may have a thickness that can be measured in a direction (e.g., the width direction WD) orthogonal to the length direction LD from the dielectric line 20 (e.g., the first surface 20S1 of the dielectric line 20). According to some embodiments, at the first end E1 of the capacitor wire WCAP, an end 30E of the outer electrode line 30 may have a thickness 30ET greater than a thickness 30T of another portion of the outer electrode line 30. In this case, the end 30E of the outer electrode line 30 may have a ring shape that surrounds the first surface 20S1 of the dielectric line 20.

According to some embodiments, the outer electrode line 30 may include or be formed of a material (e.g., metal alloy) whose melting point is less than that of the core electrode line 10. In addition, the outer electrode line 30 may include or be formed of a material (e.g., metal alloy) whose mechanical strength is less than that of the core electrode line 10. For example, the outer electrode line 30 may include or may be formed of a second metal different from the first metal, or alloy of the second metal. The outer electrode line 30 may include or be formed of, for example, at least one selected from arsenic-copper alloy, aluminum-cerium alloy, aluminum-scandium alloy, silver-germanium alloy, silver-palladium alloy, aluminum-Indium alloy, Field's metal, arsenic-antimony alloy, aluminum-magnesium alloy, magnesium-praseodymium alloy, arsenic-tin alloy, aluminum-silicon alloy, gold-magnesium alloy, aluminum-gold alloy, silver-aluminum alloy, gold-lanthanum alloy, aluminum-copper alloy, silver-calcium alloy, aluminum-calcium alloy, silver-arsenic alloy, silver-cerium alloy, gold-cerium alloy, silver-lanthanum alloy, magnesium-nickel alloy, gold-cadmium alloy, silver-antimony alloy, silver-magnesium alloy, silver-strontium alloy, Babbitt metal, aluminum-germanium alloy, magnesium-strontium alloy, gold-tellurium alloy, aluminum-zinc alloy, gold-silicon alloy, gold-antimony alloy, gold-germanium alloy, silver-tellurium alloy, magnesium-zinc alloy, and silver-lead alloy.

In operation, in the first end E1 of the capacitor wire WCAP, a first voltage V1 may be applied to the core electrode line 10 through the end 10E of the core electrode line 10. On the second end E2 of the capacitor wire WCAP, a second voltage V2 may be applied to the outer electrode line 30. The first voltage V1 and the second voltage V2 may be different from each other. For example, one of the first and second voltages V1 and V2 may be a power voltage, and the other of the first and second voltages V1 and V2 may be a ground voltage. As the core electrode line 10 and the outer electrode line 30 are provided with different voltages from each other, charges may be accumulated in the dielectric line 20 and the dielectric patterns 24. Therefore, the capacitor wire WCAP having a wire shape and serving as a capacitor may be achieved.

According to various aspects of the inventive concepts, the capacitor wire WCAP may have a wire shape and serve as a capacitor. As the capacitor wire WCAP has a wire shape, the capacitor wire WCAP may easily become compact-sized. In addition, the dielectric line 20 may have a porous structure including the plurality of holes 22P, and the dielectric patterns 24 may fill the plurality of holes 22P. The dielectric patterns 24 may include a material whose permittivity is greater than that of the dielectric line 20. Therefore, the capacitor wire WCAP may have an increased capacitance.

FIG. 5 illustrates a cross-sectional view taken along line A-A' of FIG. 1, showing a capacitor wire according to some embodiments of the present inventive concepts. For brevity of description, the following will focus on a difference from the capacitor wire discussed with reference to FIGS. 1 to 4.

Referring to FIGS. 3 and 5, the capacitor wire WCAP may include the core electrode line 10, the outer electrode line 30, and the dielectric line 20 and the dielectric patterns 24 interposed between the core electrode line 10 and the outer electrode line 30. According to some embodiments, at the first end E1 of the capacitor wire WCAP, the outer electrode line 30 may expose an end of at least one selected from the core electrode line 10 and the dielectric line 20. For example, at the first end E1 of the capacitor wire WCAP, the outer electrode line 30 may expose an end 20E of the dielectric line 20, and the end 20E of the dielectric line 20 may expose an end 10E of the core electrode line 10. The core electrode line 10 may have a spherical (or ball) shape at the end 10E thereof.

According to some embodiments, on the first end E1 of the capacitor wire WCAP, the capacitor wire WCAP may further include an oxide layer 32 that covers the end 20E of the dielectric line 20. On the first end E1 of the capacitor wire WCAP, the oxide layer 32 may surround the first surface 20S1 of the dielectric line 20 and may extend onto the end 20E of the dielectric line 20. The oxide layer 32 and the end 30E of the outer electrode line 30 may contact each other horizontally (e.g., in the length direction LD). At the first end E1 of the capacitor wire WCAP, the end 30E of the outer electrode line 30 may have a thickness 30ET substantially the same as a thickness 30T of another portion of the outer electrode line 30. The outer electrode line 30 may include or be formed of a material (e.g., metal alloy) whose melting point is less than that of the core electrode line 10, or may include or be at least one selected from Au, Ag, Pd, Cu, and Al. The oxide layer 32 may include or be an oxide of a material included in the outer electrode line 30. The oxide layer 32 may be formed by oxidizing a portion of the outer electrode line 30. The oxide layer 32 and the outer electrode line 30 may include or be formed of the same metal element.

Figure 6:
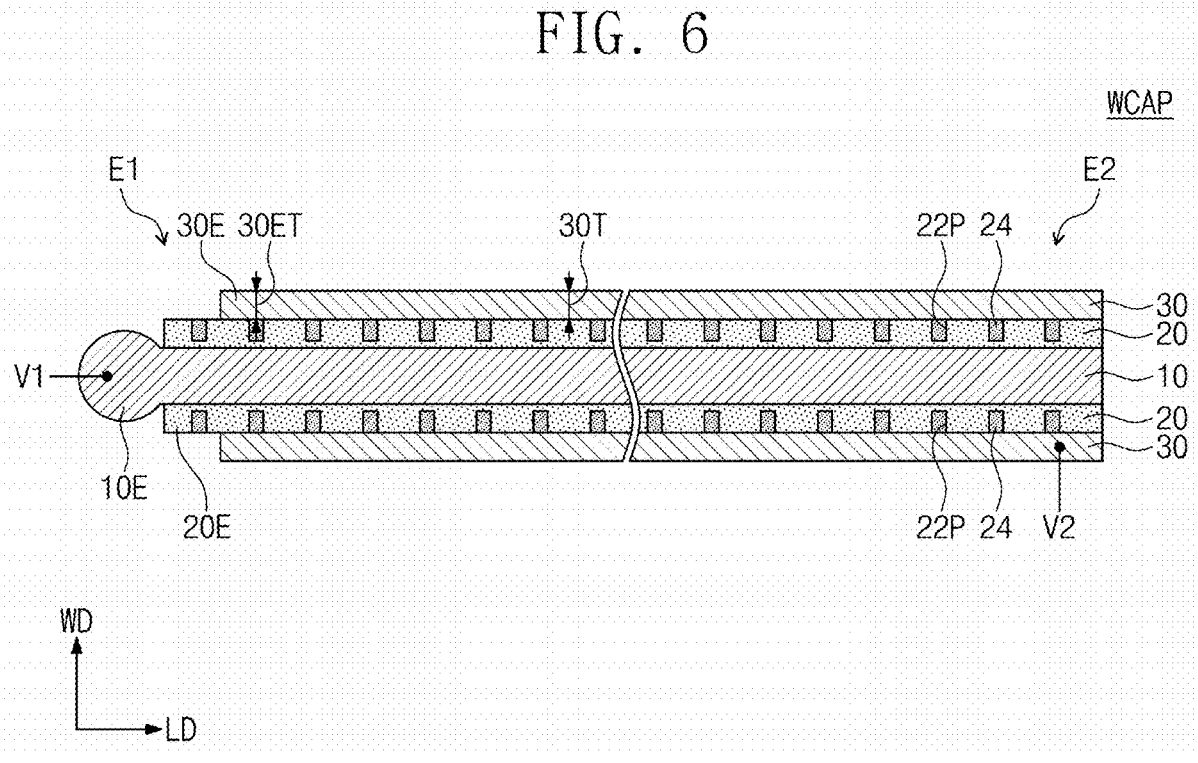

FIG. 6 illustrates a cross-sectional view taken along line A-A' of FIG. 1, showing a capacitor wire according to some embodiments of the present inventive concepts. For brevity of description, the following will focus on a difference from the capacitor wire discussed with reference to FIGS. 1 to 4.

Referring to FIGS. 3 and 6, the capacitor wire WCAP may include the core electrode line 10, the outer electrode line 30, and the dielectric line 20 and the dielectric patterns 24 interposed between the core electrode line 10 and the outer electrode line 30. According to some embodiments, at the first end E1 of the capacitor wire WCAP, the outer electrode line 30 may expose an end of at least one selected from the core electrode line 10 and the dielectric line 20. For example, at the first end E1 of the capacitor wire WCAP, the outer electrode line 30 may expose an end 20E of the dielectric line 20, and the end 20E of the dielectric line 20 may expose an end 10E of the core electrode line 10. The core electrode line 10 may have a spherical shape at the end 10E thereof.

At the first end E1 of the capacitor wire WCAP, the end 30E of the outer electrode line 30 may have a thickness 30ET substantially the same as a thickness 30T of another portion of the outer electrode line 30. The outer electrode line 30 may include or be formed of a material (e.g., metal alloy) whose melting point is less than that of the core electrode line 10, or may include or be at least one selected from Au, Ag, Pd, Cu, and Al. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

Figure 7:
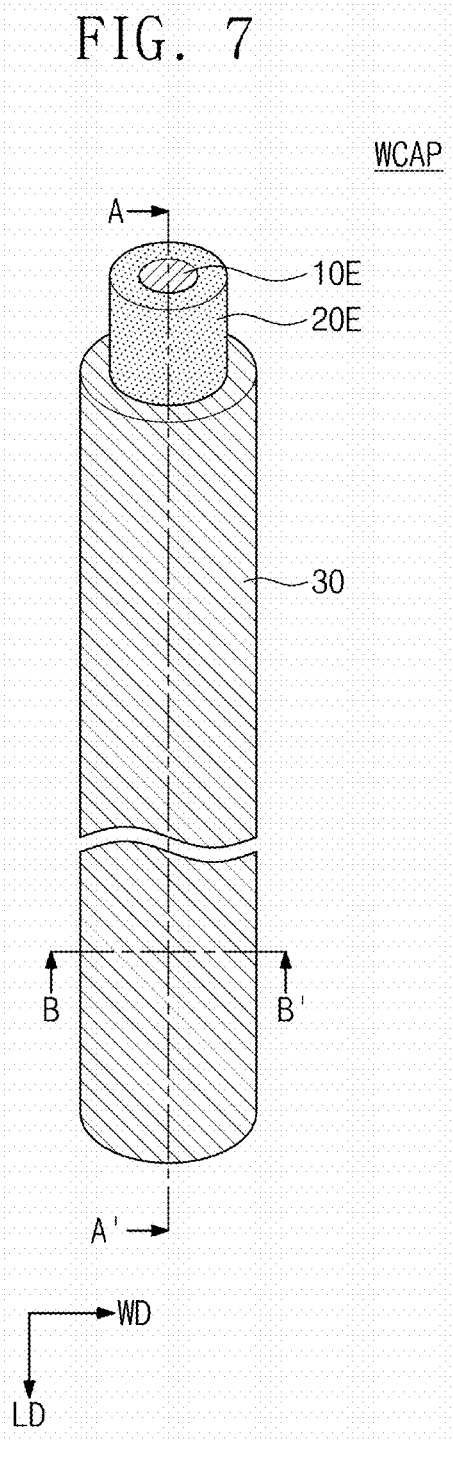
FIG. 7 illustrates a simplified perspective view showing a capacitor wire according to some embodiments of the present inventive concepts.
Figures 8, 9:
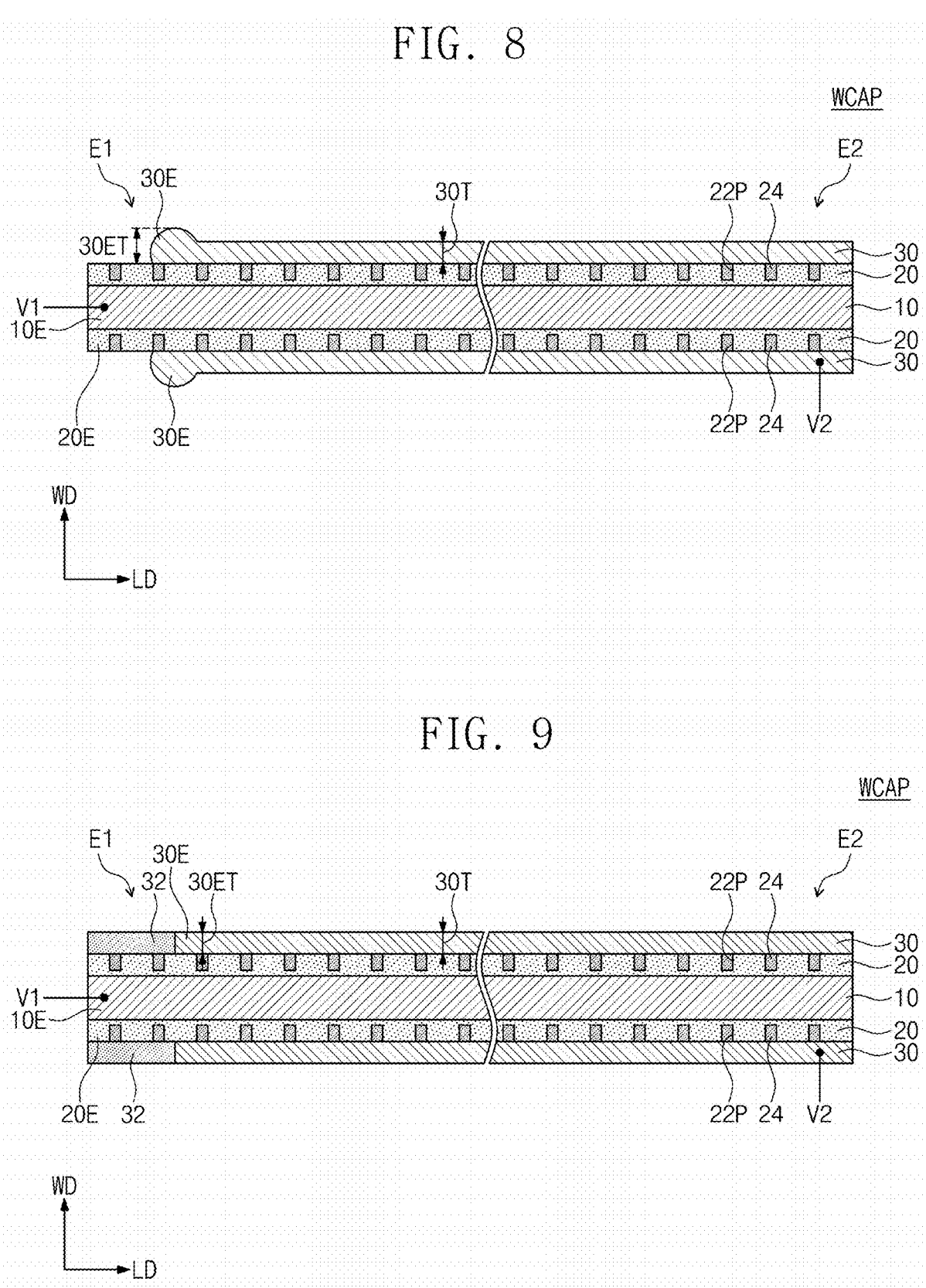
FIG. 8 illustrates a cross-sectional view taken along line A-A' of FIG. 7.
FIGS. 9 and 10 illustrate cross-sectional views taken along line A-A' of FIG. 7, showing a capacitor wire according to some embodiments of the present inventive concepts.

FIG. 7 illustrates a simplified perspective view showing a capacitor wire according to some embodiments of the present inventive concepts. FIG. 8 illustrates a cross-sectional view taken along line A-A' of FIG. 7. A cross-sectional view taken along line B-B' of FIG. 7 is the same as FIG. 3. For brevity of description, the following will focus on a difference from the capacitor wire discussed with reference to FIGS. 1 to 4.

Referring to FIGS. 3, 7, and 8, the capacitor wire WCAP may include the core electrode line 10, the outer electrode line 30, and the dielectric line 20 and the dielectric patterns 24 interposed between the core electrode line 10 and the outer electrode line 30. According to some embodiments, at the first end E1 of the capacitor wire WCAP, the outer electrode line 30 may expose an end 20E of the dielectric line 20. The end 20E of the dielectric line 20 may cover an end 10E of the core electrode line 10 (e.g., may cover outer side surfaces in the width direction WD of the core electrode line 10 at the end 10E of the core electrode line 10 up to an end surface of the core electrode line 10 perpendicular to the length direction LD of the core electrode line 10). For example, the core electrode line 10 may not protrude from the end 20E of the dielectric line 20 at the end 10E of the core electrode line 10. At the first end E1 of the capacitor wire WCAP, the end 20E of the dielectric line 20 may surround an outer surface 10S of the core electrode line 10, and may therefore extend onto the end 10E of the core electrode line 10.

According to some embodiments, at the first end E1 of the capacitor wire WCAP, an end 30E of the outer electrode line 30 may have a thickness 30ET greater than a thickness 30T of another portion of the outer electrode line 30. The end 30E of the outer electrode line 30 may have a ring shape that surrounds the first surface 20S1 of the dielectric line 20. The outer electrode line 30 may include or be formed of a material (e.g., metal alloy) whose melting point is less than that of the core electrode line 10.

FIG. 9 illustrates a cross-sectional view taken along line A-A' of FIG. 7, showing a capacitor wire according to some embodiments of the present inventive concepts. For brevity of description, the following will focus on a difference from the capacitor wire discussed with reference to FIGS. 1 to 4.

Referring to FIGS. 3, 7, and 9, the capacitor wire WCAP may include the core electrode line 10, the outer electrode line 30, and the dielectric line 20 and the dielectric patterns 24 interposed between the core electrode line 10 and the outer electrode line 30. According to some embodiments, at the first end E1 of the capacitor wire WCAP, the outer electrode line 30 may expose an end 20E of the dielectric line 20. The end 20E of the dielectric line 20 may cover an end 10E of the core electrode line 10 (e.g., side surfaces of the core electrode line 10 in the width direction WD at the end 10E of the core electrode line 10). At the first end E1 of the capacitor wire WCAP, the end of the dielectric line 20 may surround an outer surface 10S of the core electrode line and therefore may extend onto the end 10E of the core electrode line 10.

According to some embodiments, at the first end E1 of the capacitor wire WCAP, the capacitor wire WCAP may further include an oxide layer 32 that covers the end 20E of the dielectric line 20. At the first end E1 of the capacitor wire WCAP, the oxide layer 32 may surround the first surface 20S1 of the dielectric line 20 and may extend onto the end 20E of the dielectric line 20. The oxide layer 32 and the end 30E of the outer electrode line 30 may contact each other horizontally (e.g., in the length direction LD). At the first end E1 of the capacitor wire WCAP, the end 30E of the outer electrode line 30 may have a thickness 30ET substantially the same as a thickness 30T of another portion of the outer electrode line 30. The oxide layer 32 and the outer electrode line 30 may include or be formed of the same materials as those of the oxide layer 32 and the outer electrode line 30, respectively, discussed with reference to FIG. 5.

Figure 10:
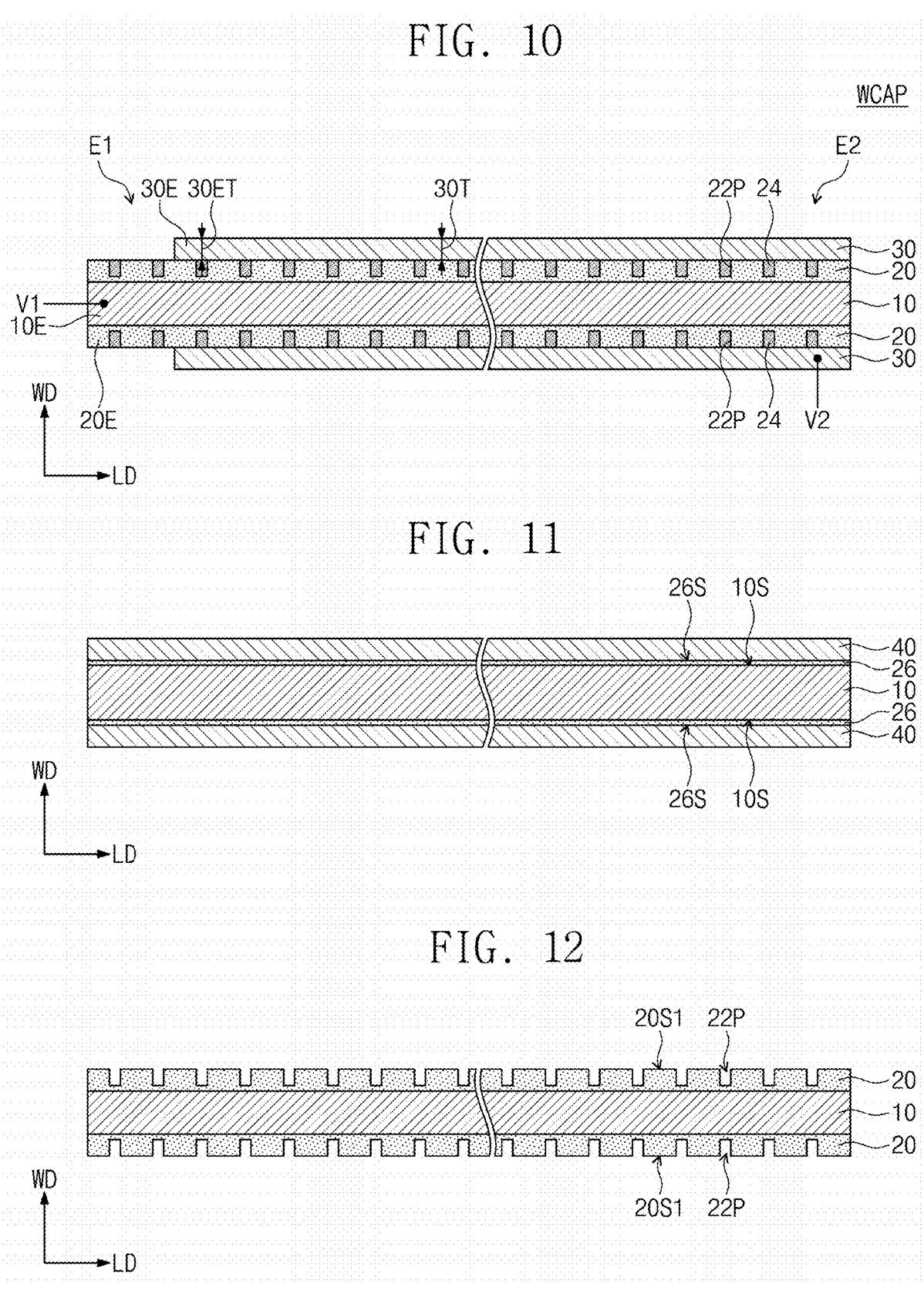

FIG. 10 illustrates a cross-sectional view taken along line A-A' of FIG. 7, showing a capacitor wire according to some embodiments of the present inventive concepts. For brevity of description, the following will focus on a difference from the capacitor wire discussed with reference to FIGS. 1 to 4.

Referring to FIGS. 3, 7, and 10, the capacitor wire WCAP may include the core electrode line 10, the outer electrode line 30, and the dielectric line 20 and the dielectric patterns 24 interposed between the core electrode line 10 and the outer electrode line 30. According to some embodiments, at the first end E1 of the capacitor wire WCAP, the outer electrode line 30 may expose an end 20E of the dielectric line 20. The end 20E of the dielectric line 20 may cover an end 10E of the core electrode line 10 (e.g., side surfaces of the core electrode line 10 in the width direction WD at the end 10E of the core electrode line 10). At the first end E1 of the capacitor wire WCAP, the end of the dielectric line 20 may surround an outer surface 10S of the core electrode line and may extend onto the end 10E of the core electrode line 10. At the first end E1 of the capacitor wire WCAP, the end 30E of the outer electrode line 30 may have a thickness 30ET substantially the same as a thickness 30T of another portion of the outer electrode line 30. The outer electrode line 30 may include or be formed of a material substantially the same as that of the outer electrode line 30 discussed with reference to FIG. 6.

FIGS. 11 to 15 illustrate cross-sectional views taken along line A-A' of FIG. 1, showing a method of fabricating a capacitor wire according to some embodiments of the present inventive concepts. For brevity of description, omission will be made to avoid explanation repetitive to that of the capacitor wire discussed with reference to FIGS. 1 to 4.

Referring to FIG. 11, a core electrode line 10 may be provided which has a wire shape. A barrier layer 26 may be formed to surround an outer surface 10S of the core electrode line 10, and a metal layer 40 may be formed to cover an outer surface 26S of the barrier layer 26. The barrier layer 26 may include or be metal oxide, and the metal layer 40 and the barrier layer 26 may include the same metal element. For example, the barrier layer 26 may include or be aluminum oxide, and the metal layer 40 may include or be aluminum. Each of the barrier layer 26 and the metal layer 40 may be formed by, for example, physical vapor deposition, chemical vapor deposition, or atomic layer deposition.

Referring to FIG. 12, the metal layer 40 may be oxidized (or anodized) by an anodizing process, and thus a dielectric line 20 may be formed. The dielectric line 20 may include the oxidized (or anodized) metal layer 40 and the barrier layer 26. The dielectric line 20 may include metal oxide. The dielectric line 20 may include a plurality of holes 22P formed by the anodizing process. Each of the plurality of holes 22P may extend into the dielectric line 20 from a first surface 20S1 of the dielectric line 20. The anodizing process may be controlled in its condition (e.g., voltage, concentration of an electrolyte, process temperature, etc.), such that it may be possible to adjust a diameter d1, a length L, and a density of the plurality of holes 22P discussed with reference to FIG. 4. The holes 22P may extend entirely through the width of the dielectric line 20, or, as shown in FIG. 12, may extend partly through the dielectric line 20. Holes 22P that extend only partly through the dielectric line 20 may also be referred to as recesses.

Figures 13, 14, 15:
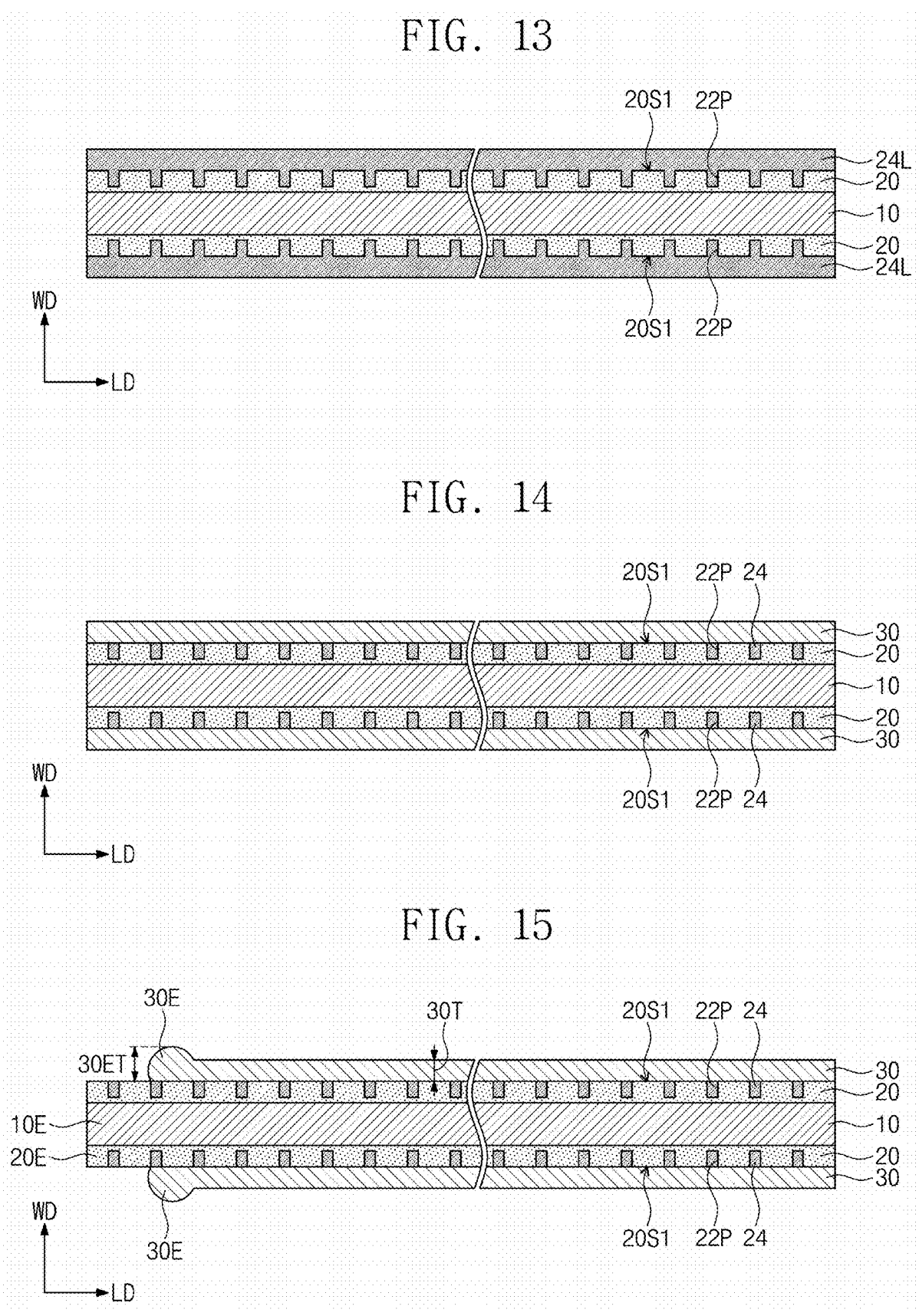

Referring to FIG. 13, a dielectric layer 24L may be formed to cover the dielectric line 20 and to fill the plurality of holes 22P. A portion of the dielectric layer 24L may fill the plurality of holes 22P, and a remainder of the dielectric layer 24L may surround the first surface 20S1 of the dielectric line 20. The dielectric layer 24L may include or be formed of a dielectric material whose permittivity (e.g., dielectric constant) is greater than that of metal oxide. The dielectric layer 24L may be formed by, for example, physical vapor deposition, chemical vapor deposition, or atomic layer deposition.

Referring to FIG. 14, dielectric patterns 24 may be formed locally in the plurality of holes 22P. The formation of the dielectric patterns 24 may include, for example, removing the remainder of the dielectric layer 24L so as to expose the first surface 20S1 of the dielectric line 20. The remainder of the dielectric layer 24L may be removed by using, for example, a dry or wet etching process.

After the formation of the dielectric patterns 24, an outer electrode line 30 may be formed to surround the first surface 20S1 of the dielectric line 20. The dielectric line 20 and the dielectric patterns 24 may be interposed between the core electrode line 10 and the outer electrode line 30. The outer electrode line 30 may be formed by, for example, physical vapor deposition, chemical vapor deposition, or atomic layer deposition. During the processes described in FIG. 12-14, as well as other processes, one or more ends of the wire may be held in place within a chamber, in order to perform the processes.

Referring to FIG. 15, according to some embodiments, a first heating process may be performed on an end 30E of the outer electrode line 30. Therefore, the end 30E of the outer electrode line 30 may be melted to have a relatively large thickness 30ET. The thickness 30ET of the end 30E of the outer electrode line 30 may be greater than a thickness 30T of another portion of the outer electrode line 30. The end 30E of the outer electrode line 30 may have a ring shape that surrounds the first surface 20S1 of the dielectric line 20, and may expose an end 20E of the dielectric line 20. The first heating process may be performed by using, for example, a laser or an electric spark. Through the method mentioned above, the capacitor wire WCAP of FIG. 8 may be fabricated.

Referring back to FIGS. 2 and 15, according to some embodiments, a second heating process may be performed on the exposed end 20E of the dielectric line 20. The second heating process may remove at least a portion of the exposed end 20E of the dielectric line 20, and may expose an end 10E of the core electrode line 10. The end 10E of the core electrode line 10 may be formed to have a spherical(or ball) shape in the second heating process. The second heating process may be performed by using, for example, a laser or an electric spark. Through the method mentioned above, the capacitor wire WCAP of FIG. 2 may be fabricated.

Figures 16, 17, 18:
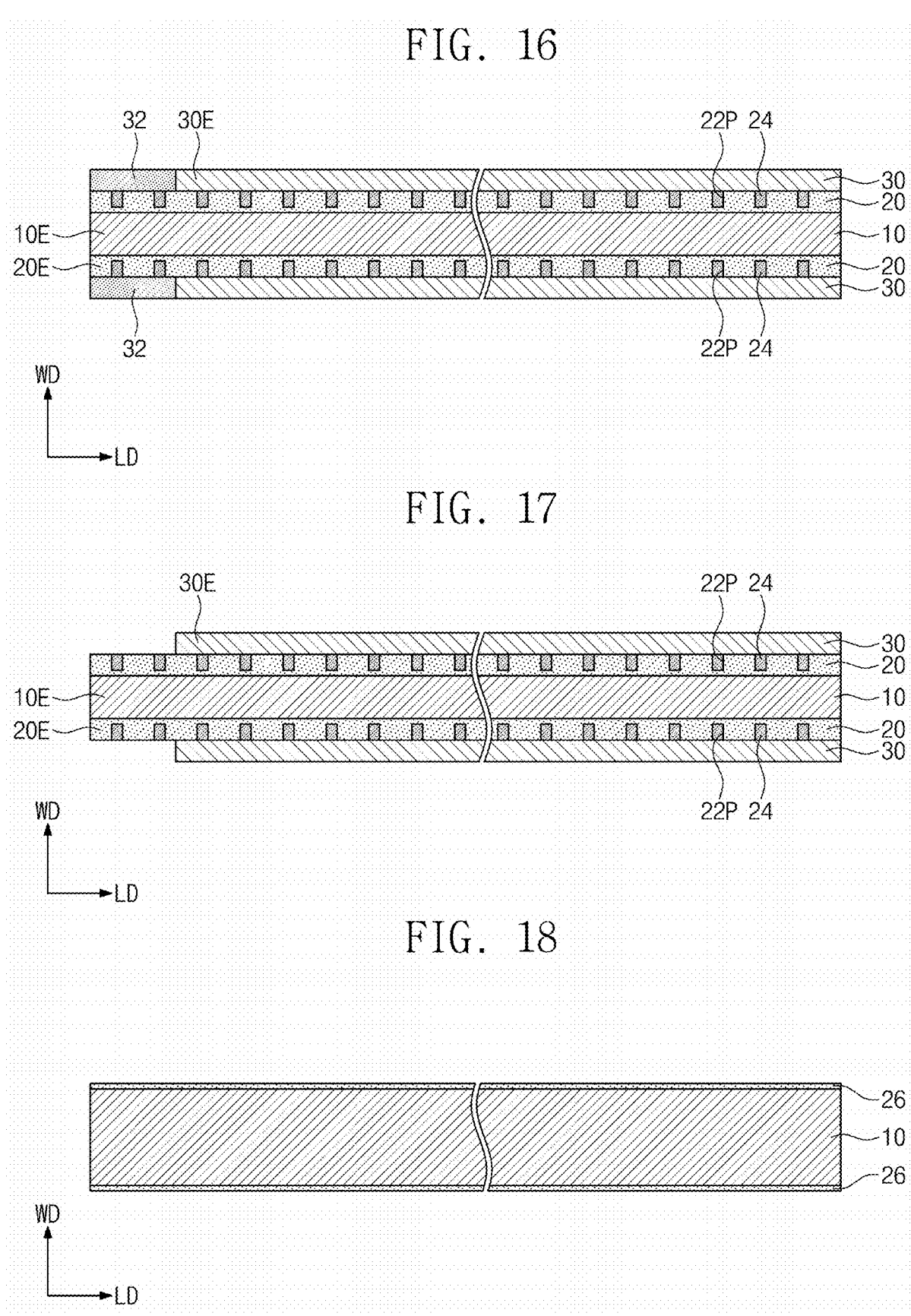
FIGS. 16 to 18 illustrate cross-sectional views taken along line A-A' of FIG. 1, showing a method of fabricating a capacitor wire according to some embodiments of the present inventive concepts.

FIG. 16 illustrates a cross-sectional view taken along line A-A' of FIG. 1, showing a method of fabricating a capacitor wire according to some embodiments of the present inventive concepts. For brevity of description, omission will be made to avoid explanation different from the method of fabricating a capacitor wire discussed with reference to FIGS. 11 to 15.

As discussed with reference to FIGS. 11 to 14, the dielectric line 20 and the dielectric patterns 24 may be formed to intervene between the core electrode line 10 and the outer electrode line 30.

Referring to FIG. 16, a portion of the outer electrode line 30 may be oxidized (or anodized), and thus an oxide layer 32 may be formed. The oxide layer 32 may surround the end 20E of the dielectric line 20 (e.g., to surround side surfaces of the dielectric line 20 in the width direction WD), and the oxide layer 32 and the end 30E of the outer electrode line 30 may contact each other horizontally (e.g., in the length direction LD). Through the method mentioned above, the capacitor wire WCAP of FIG. 9 may be fabricated.

Referring back to FIGS. 5 and 16, a heating process may be performed on the oxide layer 32. The heating process may remove at least a portion of the oxide layer 32 and at least a portion of the end 20E of the dielectric line 20, and may expose an end 10E of the core electrode line 10. The end 10E of the core electrode line 10 may be formed to have a spherical (or ball) shape in heating process. The heating process may be performed by using, for example, a laser or an electric spark. Through the method mentioned above, the capacitor wire WCAP of FIG. 5 may be fabricated.

FIG. 17 illustrates a cross-sectional view taken along line A-A' of FIG. 1, showing a method of fabricating a capacitor wire according to some embodiments of the present inventive concepts. For brevity of description, omission will be made to avoid explanation different from the method of fabricating a capacitor wire discussed with reference to FIGS. 11 to 15.

As discussed with reference to FIGS. 11 to 14, the dielectric line 20 and the dielectric patterns 24 may be formed to intervene between the core electrode line 10 and the outer electrode line 30.

Referring to FIG. 17, a portion of the outer electrode line 30 may be removed to expose an end 20E of the dielectric line 20. The portion of the outer electrode line 30 may be removed by, for example, a dry or wet etching process. For example, the portion of the outer electrode line 30 may be removed by a plasma etching process. Through the method mentioned above, the capacitor wire WCAP of FIG. 10 may be fabricated.

Referring back to FIGS. 6 and 17, a heating process may be performed on the exposed end 20E of the dielectric line 20. The heating process may remove at least a portion of the exposed end 20E of the dielectric line 20, and may expose an end 10E of the core electrode line 10. The end 10E of the core electrode line 10 may be formed to have a spherical(or ball) shape in heating process. The heating process may be performed by using, for example, a laser or an electric spark. Through the method mentioned above, the capacitor wire WCAP of FIG. 6 may be fabricated.

FIG. 18 illustrates a cross-sectional view taken along line A-A' of FIG. 1, showing a method of fabricating a capacitor wire according to some embodiments of the present inventive concepts. For brevity of description, omission will be made to avoid explanation different from the method of fabricating a capacitor wire discussed with reference to FIGS. 11 to 17.

Referring to FIG. 18, a core electrode line 10 may be provided which has a wire shape. A barrier layer 26 may be formed to surround an outer surface 10S of the core electrode line 10. The barrier layer 26 may include or be a metal oxide. According to some embodiments, the core electrode line 10 and the barrier layer 26 may include the same metal element. For example, the barrier layer 26 may include or be aluminum oxide, and the core electrode line 10 may include or be aluminum. According to some embodiments, a width in the width direction WD of the core electrode line 10 may be relatively large.

Referring back to FIG. 12, a portion of the core electrode line 10 may be oxidized (or anodized) by an anodizing process, and thus a dielectric line 20 may be formed. The dielectric line 20 may include the barrier layer 26 and the oxidized (or anodized) portion of the core electrode line 10. The dielectric line 20 may include or be formed of metal oxide. The dielectric line 20 may include a plurality of holes 22P formed by the anodizing process. Each of the plurality of holes 22P may extend into the dielectric line 20 from a first surface 20S1 of the dielectric line 20.

Subsequent processes may be substantially the same as those in the method of fabricating a capacitor wire discussed with reference to FIGS. 13 to 17.

Figures 19, 20:
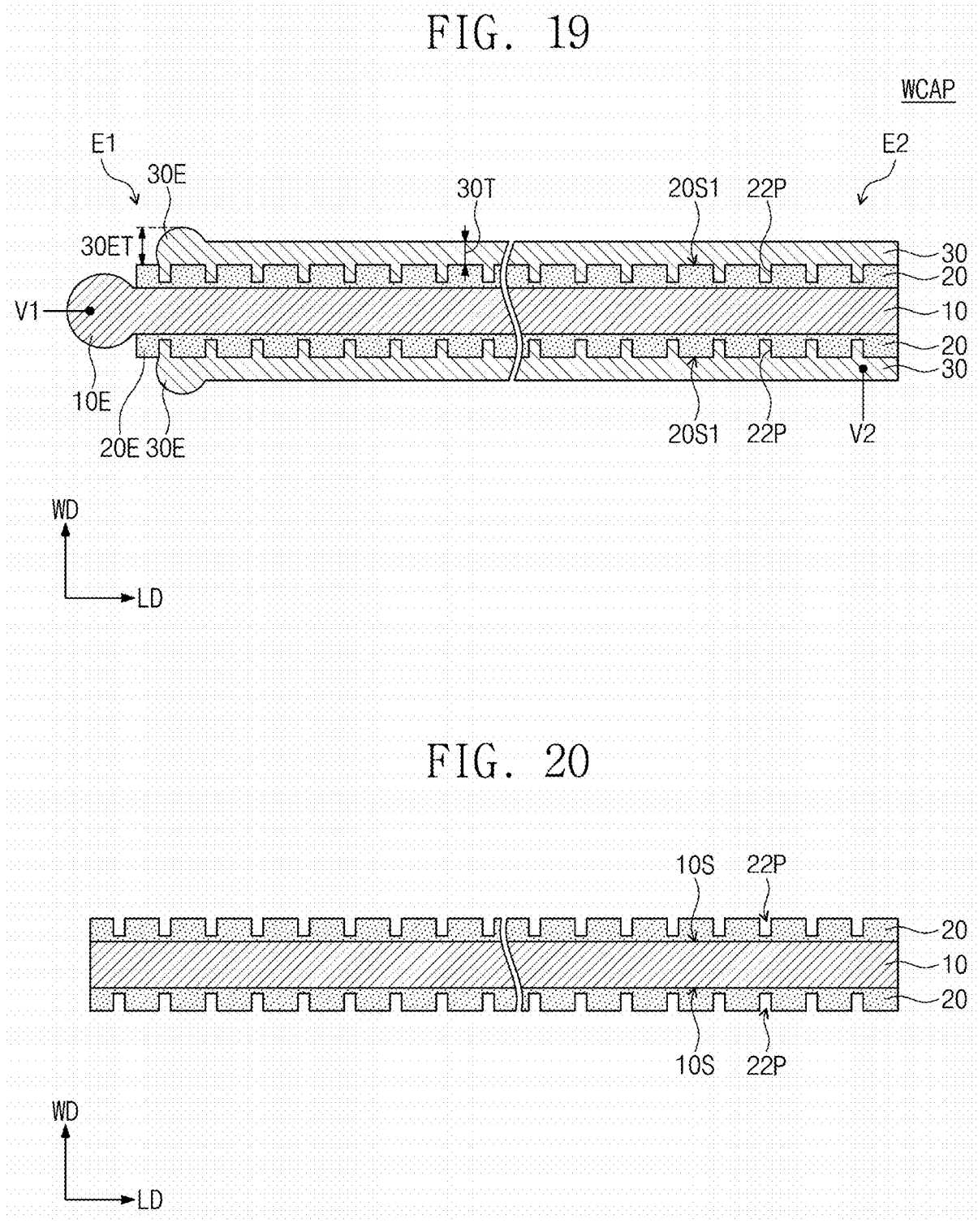
FIG. 19 illustrates a cross-sectional view taken along line A-A' of FIG. 1, showing a capacitor wire according to some embodiments of the present inventive concepts.
FIGS. 20 to 22 illustrate cross-sectional views taken along line A-A' of FIG. 1, showing a method of fabricating a capacitor wire according to some embodiments of the present inventive concepts.

FIG. 19 illustrates a cross-sectional view taken along line A-A' of FIG. 1, showing a capacitor wire according to some embodiments of the present inventive concepts. For brevity of description, the following will focus on a difference from the capacitor wire discussed with reference to FIGS. 1 to 4.

Referring to FIG. 19, the dielectric line 20 may have a porous structure having the plurality of holes 22P. According to some embodiments, the outer electrode line 30 may cover the dielectric line 20 and may fill the plurality of holes 22P. The outer electrode line 30 may surround the first surface 20S1 (or outer surface) of the dielectric line 20, and may extend in the length direction LD along the first surface 20S1 (or outer surface) of the dielectric line 20. The dielectric line 20 may be disposed between the core electrode line 10 and the outer electrode line 30, and the dielectric line 20 may electrically separate (or isolate) the outer electrode line 30 from the core electrode line 10.

At the first end E1 of the capacitor wire WCAP, the first voltage V1 may be applied to the core electrode line 10 through the end 10E of the core electrode line 10. At the second end E2 of the capacitor wire WCAP, the outer electrode line 30 may be provided with the second voltage V2 different from the first voltage V1. As the core electrode line 10 and the outer electrode line 30 are provided with different voltages from each other, charges may be accumulated in the dielectric line 20. Therefore, the capacitor wire WCAP having a wire shape and serving as a capacitor may be achieved.

According to some embodiments, the dielectric line 20 may have a porous structure including the plurality of holes 22P, and the outer electrode line 30 may fill the plurality of holes 22P. Therefore, there may be an increased adhesion between the dielectric line 20 and the outer electrode line 30. According to some embodiments, the dielectric patterns 24 may be omitted from the capacitor wires WCAP discussed with reference to FIGS. 5 to 10, and the outer electrode line 30 may fill the plurality of holes 22P as discussed with reference to FIG. 19.

Figures 21, 22:
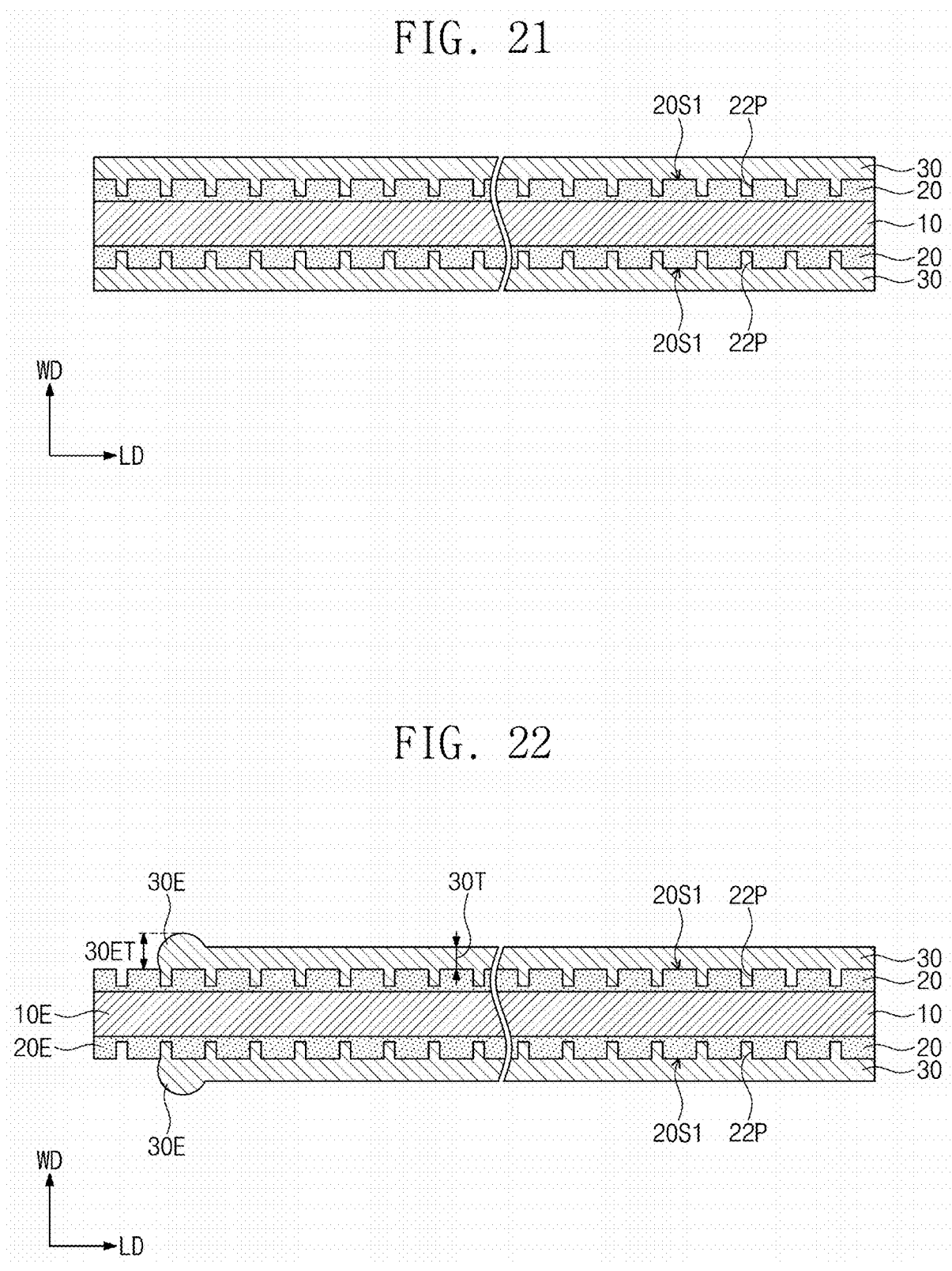

FIGS. 20 to 22 illustrate cross-sectional views taken along line A-A' of FIG. 1, showing a method of fabricating a capacitor wire according to some embodiments of the present inventive concepts. For brevity of description, omission will be made to avoid explanation different from the method of fabricating a capacitor wire discussed with reference to FIGS. 11 to 15.

Referring to FIG. 20, a wire-shaped core electrode line 10 may be provided, and a dielectric line 20 may be formed to surround an outer surface 10S of the core electrode line 10. The dielectric line 20 may have a porous structure having a plurality of holes 22P. The dielectric line 20 may be formed by a method substantially the same as that discussed with reference to FIGS. 11 and 12.

Referring to FIG. 21, an outer electrode line 30 may be formed to surround a first surface 20S1 of the dielectric line 20 and to fill the plurality of holes 22P. According to some embodiments, the formation of the dielectric patterns 24 may be omitted which is discussed with reference to FIGS. 11 to 15, and the dielectric line 20 may be interposed between the core electrode line 10 and the outer electrode line 30.

Referring to FIG. 22, according to some embodiments, a first heating process may be performed on an end 30E of the outer electrode line 30. Therefore, the end 30E of the outer electrode line 30 may be melted to have a relatively large thickness 30ET. The thickness 30ET of the end 30E of the outer electrode line 30 may be greater than a thickness 30T of another portion of the outer electrode line 30. The end 30E of the outer electrode line 30 may have a ring shape that surrounds the first surface 20S1 of the dielectric line 20, and may expose an end 20E of the dielectric line 20. A second heating process may be performed on the exposed end 20E of the dielectric line 20.

Referring back to FIG. 19, the second heating process may remove at least a portion of the exposed end 20E of the dielectric line 20, and may expose an end 10E of the core electrode line 10. The end 10E of the core electrode line 10 may be formed to have a spherical(or ball) shape in the second heating process. Through the method mentioned above, the capacitor wire WCAP of FIG. 19 may be fabricated.

Figures 23, 24:
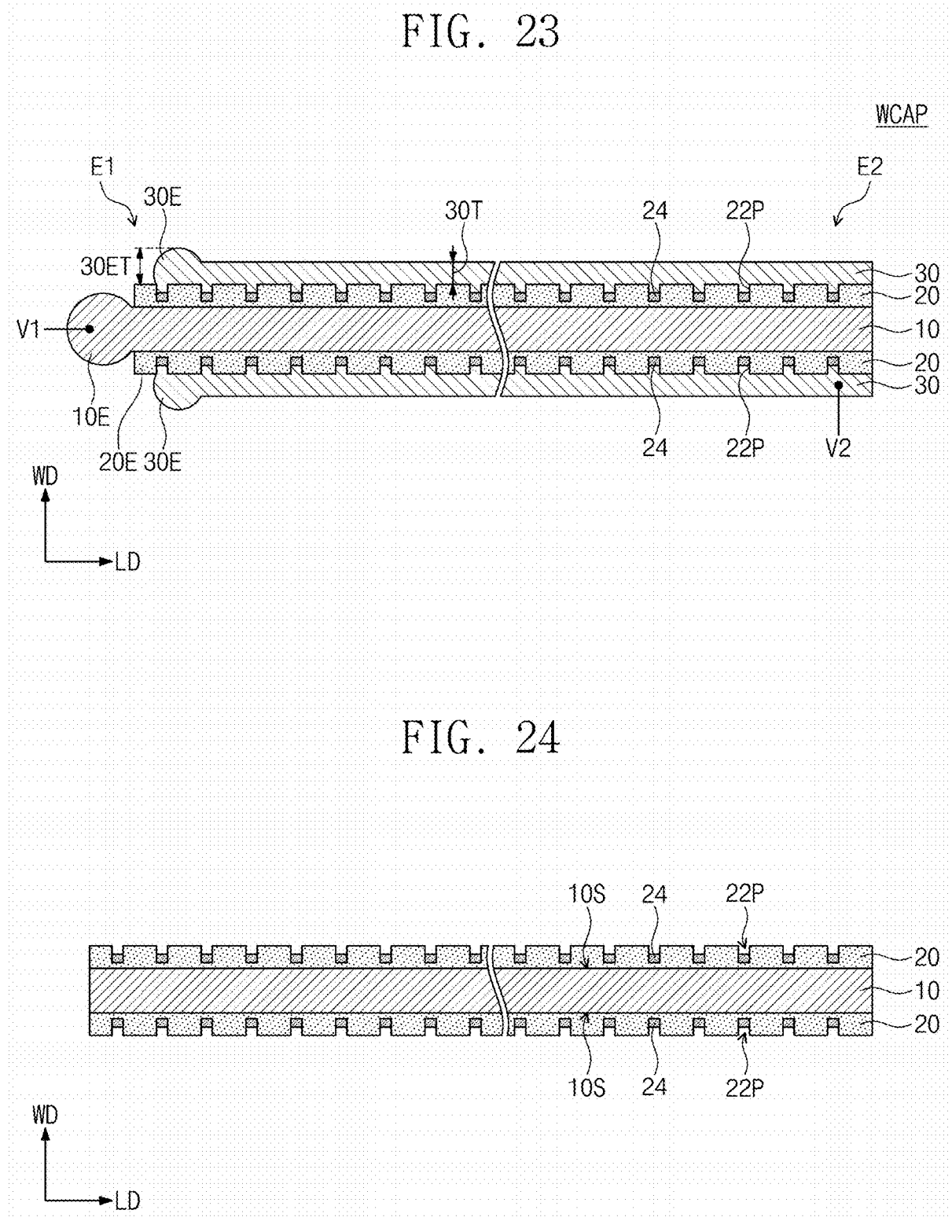
FIG. 23 illustrates a cross-sectional view taken along line A-A' of FIG. 1, showing a capacitor wire according to some embodiments of the present inventive concepts.
FIGS. 24 to 26 illustrate cross-sectional views taken along line A-A' of FIG. 1, showing a method of fabricating a capacitor wire according to some embodiments of the present inventive concepts.

FIG. 23 illustrates a cross-sectional view taken along line A-A' of FIG. 1, showing a capacitor wire according to some embodiments of the present inventive concepts. For brevity of description, the following will focus on a difference from the capacitor wire discussed with reference to FIGS. 1 to 4.

Referring to FIG. 23, the dielectric line 20 may have a porous structure having the plurality of holes 22P, and dielectric patterns 24 may fill the plurality of holes 22P. According to some embodiments, each of the dielectric patterns 24 may fill a portion of a corresponding one of the plurality of holes 22P. The outer electrode line 30 may cover the dielectric line 20 and may extend into the plurality of holes 22P. The outer electrode line 30 may fill a remaining portion of each of the plurality of holes 22P. The dielectric line 20 and the dielectric patterns 24 may be disposed between the core electrode line 10 and the outer electrode line 30, and may electrically separate (or isolate) the outer electrode line 30 from the core electrode line 10.

At the first end E1 of the capacitor wire WCAP, the first voltage V1 may be applied to the core electrode line 10 through the end 10E of the core electrode line 10. At the second end E2 of the capacitor wire WCAP, the outer electrode line 30 may be provided with the second voltage V2 different from the first voltage V1. As the core electrode line 10 and the outer electrode line 30 are provided with different voltages from each other, charges may be accumulated in the dielectric line 20 and the dielectric patterns 24. Therefore, the capacitor wire WCAP having a wire shape and serving as a capacitor may be achieved.

According to some embodiments, the dielectric line 20 may have a porous structure including the plurality of holes 22P, and the dielectric patterns 24 may be provided in the plurality of holes 22P. The dielectric patterns 24 may include a material whose permittivity is greater than that of the dielectric line 20, and thus the capacitor wire WCAP may have an increased capacitance. In addition, the outer electrode line 30 may extend into the plurality of holes 22P, and thus there may be an increased adhesion between the dielectric line 20 and the outer electrode line 30. According to some embodiments, the capacitor wires WCAP discussed with reference to FIGS. 5 to 10 may each include the outer electrode line 30 that extends into the plurality of holes 22P as discussed with reference to FIG. 23. As discussed in this embodiment and others, in operation, a first voltage may be applied to the core electrode line 10 at a first end (e.g., E1) of the capacitor wire WCAP, and a second different voltage may be applied to the outer electrode line 30 at the second end (e.g., E2) of the capacitor wire WCAP. In order to apply the first voltage to the core electrode line 10 at the first end, the core electrode line may be connected to a pad connected to a first voltage source using, for example, ball bonding or wedge bonding. In order to apply the second voltage to the outer electrode line 30 without also applying it to the core electrode line 10 at the second end, the outer electrode line 30 may be connected to a pad connected to a second voltage source using, for example, ball bonding or wedge bonding.

Figures 25, 26:
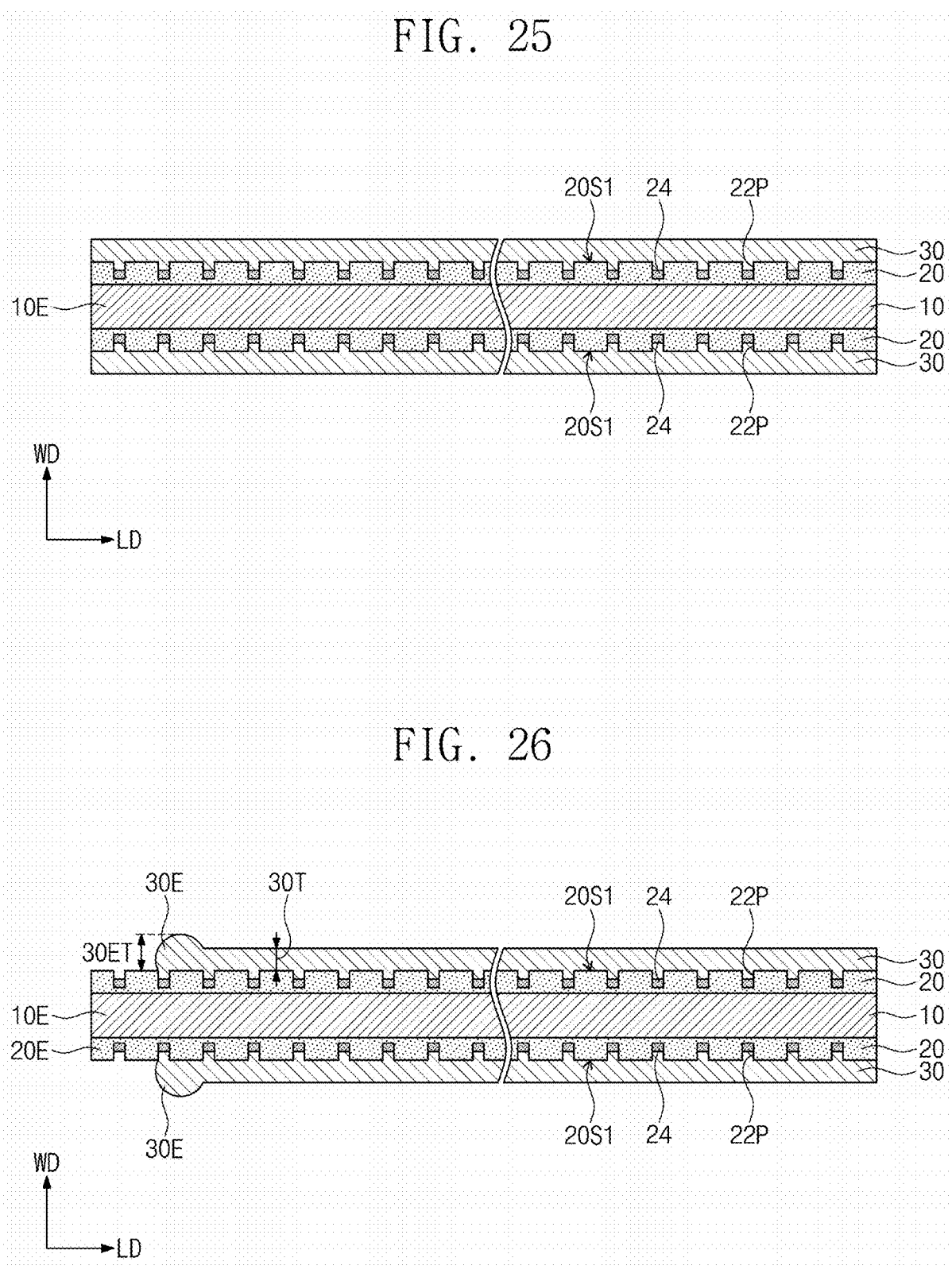

FIGS. 24 to 26 illustrate cross-sectional views taken along line A-A' of FIG. 1, showing a method of fabricating a capacitor wire according to some embodiments of the present inventive concepts. For brevity of description, omission will be made to avoid explanation different from the method of fabricating a capacitor wire discussed with reference to FIGS. 11 to 15.

Referring to FIG. 24, a wire-shaped core electrode line 10 may be provided, and a dielectric line 20 may be formed to surround an outer surface 10S of the core electrode line 10. The dielectric line 20 may have a porous structure having a plurality of holes 22P. The dielectric patterns 24 may be formed to fill the plurality of holes 22P. Each of the dielectric patterns 24 may fill a portion of a corresponding one of the plurality of holes 22P. The dielectric line 20 and the dielectric patterns 24 may be formed by a method substantially the same as that discussed with reference to FIGS. 11 and 14.

Referring to FIG. 25, an outer electrode line 30 may be formed to surround a first surface 20S1 of the dielectric line 20 and to extend into the plurality of holes 22P. The outer electrode line 30 may fill a remaining portion of each of the plurality of holes 22P. The dielectric line 20 and the dielectric patterns 24 may be interposed between the core electrode line 10 and the outer electrode line 30.

Referring to FIG. 26, according to some embodiments, a first heating process may be performed at an end 30E of the outer electrode line 30. Therefore, the end 30E of the outer electrode line 30 may be melted to have a relatively large thickness 30ET. The thickness 30ET of the end 30E of the outer electrode line 30 may be greater than a thickness 30T of another portion of the outer electrode line 30. The end 30E of the outer electrode line 30 may have a ring shape that surrounds the first surface 20S1 of the dielectric line 20, and may expose an end 20E of the dielectric line 20. A second heating process may be performed on the exposed end 20E of the dielectric line 20.

Referring back to FIG. 23, the second heating process may remove at least a portion of the exposed end 20E of the dielectric line 20, and may expose an end 10E of the core electrode line 10. The end 10E of the core electrode line 10 may be formed to have a spherical(or ball) shape in the second heating process. Through the method mentioned above, the capacitor wire WCAP of FIG. 23 may be fabricated.

Figure 27:
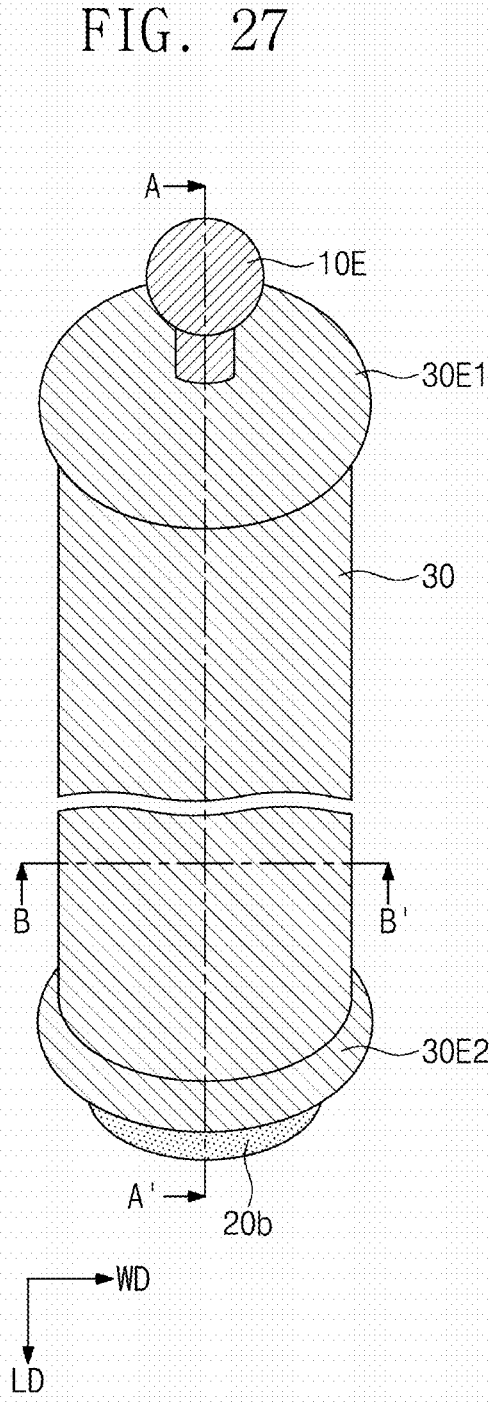
FIG. 27 illustrates a simplified perspective view showing a capacitor wire according to some embodiments of the present inventive concepts.
Figures 28, 29:
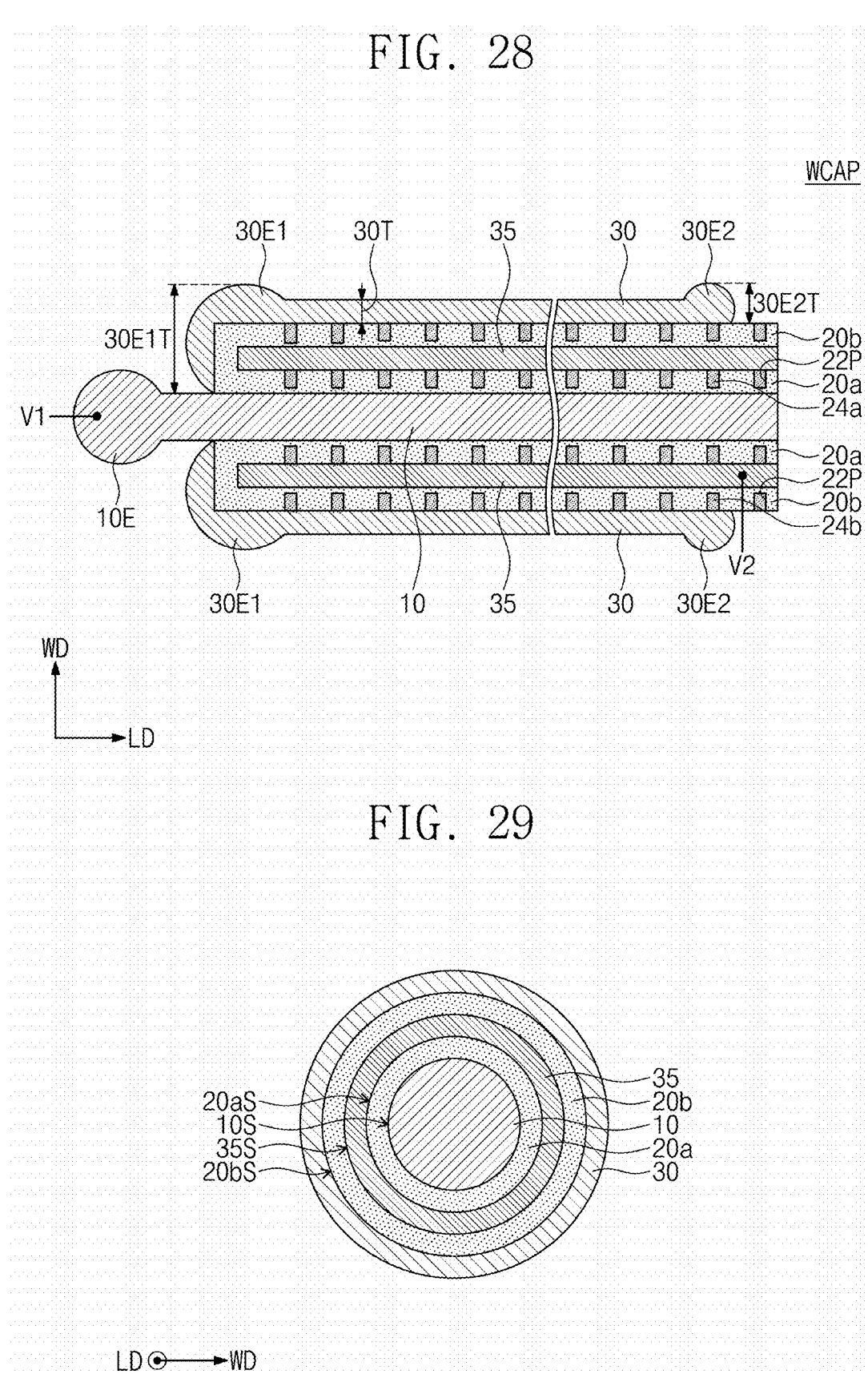
FIG. 28 illustrates a cross-sectional view taken along line A-A' of FIG. 27.
FIG. 29 illustrates a cross-sectional view taken along line B-B' of FIG. 27.

It should be noted that various of the features described herein can be combined with other features, even if the combination is not explicitly described. For example, the alternate inclusion of only part of the holes 22P being filled with dielectric patterns 24 can be used in any of the previous embodiments that describe entirely filling the holes 22P with a dielectric pattern 24. Other combinations of features are intended in this specification accordingly for different embodiments that are not mutually exclusive of other embodiments FIG. 27 illustrates a simplified perspective view showing a capacitor wire according to some embodiments of the present inventive concepts. FIG. 28 illustrates a cross-sectional view taken along line A-A' of FIG. 27. FIG. 29 illustrates a cross-sectional view taken along line B-B' of FIG. 27. For brevity of description, the following will focus on a difference from the capacitor wire discussed with reference to FIGS. 1 to 4.

Referring to FIGS. 27 to 29, a capacitor wire WCAP may include a core electrode line 10, an outer electrode line 30 that covers at least a portion of the core electrode line 10, an inner electrode line 35 interposed between the core electrode line 10 and the outer electrode line 30, and a dielectric line 20a and 20b interposed between the core electrode line 10 and the inner electrode line 35 and between the inner electrode line 35 and the outer electrode line 30.

The core electrode line 10 may have a wire shape, for example, a rounded shape (e.g., circular shape) at a cross section in the width direction WD. Alternatively, differently from that shown, the core electrode line 10 may have a polygonal shape (e.g., rectangular shape) at a cross section in the width direction WD.

The dielectric line 20a and 20b may include a first dielectric line 20a interposed between the core electrode line 10 and the inner electrode line 35, and a second dielectric line 20b interposed between the inner electrode line 35 and the outer electrode line 30. The first dielectric line 20a may cover at least a portion of the core electrode line 10, and may extend in the length direction LD between the core electrode line 10 and the inner electrode line 35. The first dielectric line 20a may cover an outer surface 10S of the core electrode line 10, and may extend in the length direction LD along the outer surface 10S of the core electrode line 10.

The inner electrode line 35 may cover at least a portion of the first dielectric line 20*a*, and may extend in the length direction LD between the first dielectric line 20*a* and the second dielectric line 20*b*. The inner electrode line 35 may cover an outer surface of the first dielectric line 20*a*, and may extend in the length direction LD along the outer surface 20S of the first dielectric line 20*a*. The first dielectric line 20*a* may electrically separate (or isolate) the inner electrode line 35 from the core electrode line 10.

The inner electrode line 35 may include or be formed of a material (e.g., metal alloy) whose melting point is less than that of the core electrode line 10 and greater than that of the outer electrode line 30. In addition, the inner electrode line 35 may include or be formed of a material (e.g., metal alloy) whose mechanical strength is less than that of the core electrode line 10. For example, the core electrode line 10 may include or be formed of a first metal, and the inner electrode line 35 may include or be formed of a third metal different from the first metal. The outer electrode line 30 may include or be formed of a second metal. The inner electrode line 35 may include or be formed of, for example, at least one selected from arsenic-copper alloy, aluminum-cerium alloy, aluminum-scandium alloy, silver-germanium alloy, silver-palladium alloy, aluminum-Indium alloy, Field's metal, arsenic-antimony alloy, aluminum-magnesium alloy, magnesium-praseodymium alloy, arsenic-tin alloy, aluminum-silicon alloy, gold-magnesium alloy, aluminum-gold alloy, silver-aluminum alloy, gold-lanthanum alloy, aluminum-copper alloy, silver-calcium alloy, aluminum-calcium alloy, silver-arsenic alloy, silver-cerium alloy, gold-cerium alloy, silver-lanthanum alloy, magnesium-nickel alloy, gold-cadmium alloy, silver-antimony alloy, silver-magnesium alloy, silver-strontium alloy, Babbitt metal, aluminum-germanium alloy, magnesium-strontium alloy, gold-tellurium alloy, aluminum-zinc alloy, gold-silicon alloy, gold-antimony alloy, gold-germanium alloy, silver-tellurium alloy, magnesium-zinc alloy, and silver-lead alloy. The core electrode line 10, inner electrode line 35, and outer electrode line 30 may be referred to in different ways in relation to each other—for example, as an inner (or core) electrode line (e.g., 10), a middle electrode line 35, and an outer electrode line 30. Also, an outermost electrode line of any of the embodiments may be referred to as an outermost electrode line, and the core electrode line may be referred to as an innermost electrode line, while any additional electrode lines, such as electrode line 35 in FIG. 28, may be described as middle electrode lines, inner electrode lines, or outer electrode lines as they relate to the innermost and outermost electrode lines. However named, from a cross section view in the width direction WD, the electrode line surrounds both electrode lines 10 and 35, and the electrode line 35 surrounds the electrode line 10.

The second dielectric line 20*b* may cover at least a portion of the inner electrode line 35, and may extend in the length direction LD between the inner electrode line 35 and the outer electrode line 30. The second dielectric line 20*b* may cover an outer surface 35S of the inner electrode line 35, and may extend in the length direction LD along the outer surface 35S of the inner electrode line 35. The second dielectric line 20*b* may cover an end of the inner electrode line 35 and may connect the first dielectric line for example, through a connection portion extending in the width direction WD. The first and second dielectric lines 20*a* and 20*b* may be connected to constitute a single unitary body.

The outer electrode line 30 may cover at least a portion of the second dielectric line 20*b* and may extend in the length direction LD. The outer electrode line 30 may cover an outer surface 20*b*S of the second dielectric line 20*b*, and may extend in the length direction LD along the outer surface 20*b*S of the second dielectric line 20*b*. The second dielectric line 20*b* may electrically separate (or isolate) the outer electrode line 30 from the inner electrode line 35. The outer electrode line 30 may include or be formed of a material (e.g., metal alloy) whose melting point is less than that of the core electrode line 10 and that of the inner electrode line 35. In addition, the outer electrode line 30 may include or be formed of a material (e.g., metal alloy) whose mechanical strength is less than that of the core electrode line 10. For example, the outer electrode line 30 may include or be a second metal different from the first metal, or an alloy of the second metal. The outer electrode line 30 may include or be formed of the same material as that of the outer electrode line 30 discussed with reference to FIGS. 1 to 4.

Each of the first and second dielectric lines 20*a* and 20*b* may have a porous structure having a plurality of holes 22P. Each of the plurality of holes 22P included in the first dielectric line 20*a* may extend into the first dielectric line 20*a* from the outer surface 20*a*S of the first dielectric line 20*a*. Each of the plurality of holes 22P included in the second dielectric line 20*b* may extend into the second dielectric line 20*b* from the outer surface 20*b*S of the second dielectric line 20*b*. The plurality of holes 22P may be substantially the same as the plurality of holes 22P discussed with reference to FIGS. 1 to 4.

The capacitor wire WCAP may further include first dielectric patterns 24*a* that fill the plurality of holes 22P of the first dielectric line 20*a* and second dielectric patterns 24*b* that fill the plurality of holes 22P of the second dielectric line 20*b*. The first dielectric patterns 24*a* may include or be formed of a material whose permittivity (e.g., dielectric constant) is greater than that of the first dielectric line 20*a*, and the second dielectric patterns 24*b* may include or be formed of a material whose permittivity (e.g., dielectric constant) is greater than that of the second dielectric line 20*b*. For example, the first dielectric line 20*a* and the second dielectric line 20*b* may include or be formed of the same material as that of the dielectric line 20 discussed with reference to FIGS. 1 to 4, and the first dielectric patterns 24*a* and the second dielectric patterns 24*b* may include or be formed of the same material as that of the dielectric patterns 24 discussed with reference to FIGS. 1 to 4. The first dielectric line 20*a* and the first dielectric patterns 24*a* may be interposed between the core electrode line 10 and the inner electrode line 35, and the second dielectric line 20*b* and the second dielectric patterns 24*b* may be interposed between the Inner electrode line 35 and the outer electrode line 30. In an alternative embodiment, dielectric patterns that partially fill the first and second dielectric lines 20*a* and 20*b* may be used, similar to those described in the embodiment of FIG. 23.

The capacitor wire WCAP may have a first end E1 and a second end E2 that are opposite to each other in the length direction LD of the core electrode line 10. According to some embodiments, at the first end E1 of the capacitor wire WCAP, an end of the outer electrode line 30 may cover ends of the first and second dielectric lines 20*a* and 20*b* and may expose an end 10E of the core electrode line 10. At the second end E2 of the capacitor wire WCAP, another end 30E2 of the outer electrode line 30 may expose an end of the second dielectric line 20*b*. According to some embodiments, a thickness 30E1T at the end 30E1 of the outer electrode line 30 may be greater than a thickness 30T of another portion of the outer electrode line 30. The end 30E1 of the outer electrode line 30 may have a ring shape that covers ends of the first and second dielectric lines 20a and 20b and surrounds the outer surface 10S of the core electrode line 10. A thickness 30E2T of the other end 30E2 of the outer electrode line 30 may be greater than the thickness 30T of the other portion of the outer electrode line 30. The other end 30E2 of the outer electrode line 30 may have a ring shape that surrounds the outer surface 20bS of the second dielectric line 20b.

A first voltage V1 may be applied to the core electrode line 10 through the end 10E of the core electrode line 10 (e.g., the core electrode line 10 at the end 10E may be connected to a first pad through which a first voltage V1 is applied, using, for example, ball bonding). The end 30E1 of the outer electrode line 30 may be in contact with the core electrode line 10, and thus the first voltage V1 may be applied to the outer electrode line 30 as well. For example, the same voltage may be applied to the core electrode line 10 and the outer electrode line 30. A second voltage V2 may be applied to the inner electrode line 35, and the first voltage V1 and the second voltage V2 may be different from each other. For example, the other end 30E2 of the outer electrode line 30 may expose an end portion of the second dielectric line 20b, and an end portion of the inner electrode line 35 may be connected to a second pad through which a second voltage V1 is applied, using, for example, wedge bonding. In this case, during the wedge bonding, the end portion of the second dielectric line 20b may be removed to expose the end portion of the inner electrode line 35. For example, one of the first and second voltages V1 and V2 may be a power voltage, and the other of the first and second voltages V1 and V2 may be a ground voltage. As the core electrode line 10 and the inner electrode line 35 are provided with different voltages from each other, charges may be accumulated in the first dielectric line 20a, and as the inner electrode line 35 and the outer electrode line 30 are provided with different voltages from each other, charges may be accumulated in the second dielectric line 20b. Therefore, the capacitor wire WCAP having a wire shape and serving as a capacitor may be achieved.

FIGS. 30 to 33 illustrate cross-sectional views taken along line A-A' of FIG. 27, showing a method of fabricating a capacitor wire according to some embodiments of the present inventive concepts. For brevity of description, omission will be made to avoid explanation repetitive to that of the capacitor wire discussed with reference to FIGS. 27 to 29.

Figure 30:
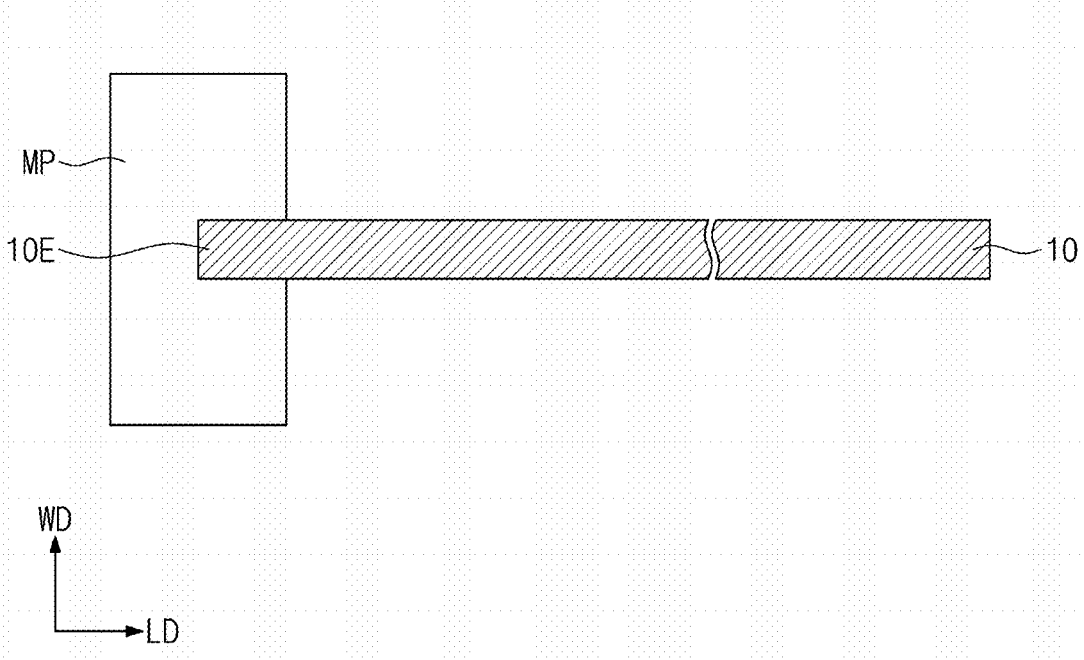
FIGS. 30 to 33 illustrate cross-sectional views taken along line A-A' of FIG. 27, showing a method of fabricating a capacitor wire according to some embodiments of the present inventive concepts.

Referring to FIG. 30, a core electrode line 10 may be provided which has a wire shape. A mask pattern MP may be provided to surround an end 10E of the core electrode line 10.

Figure 31:
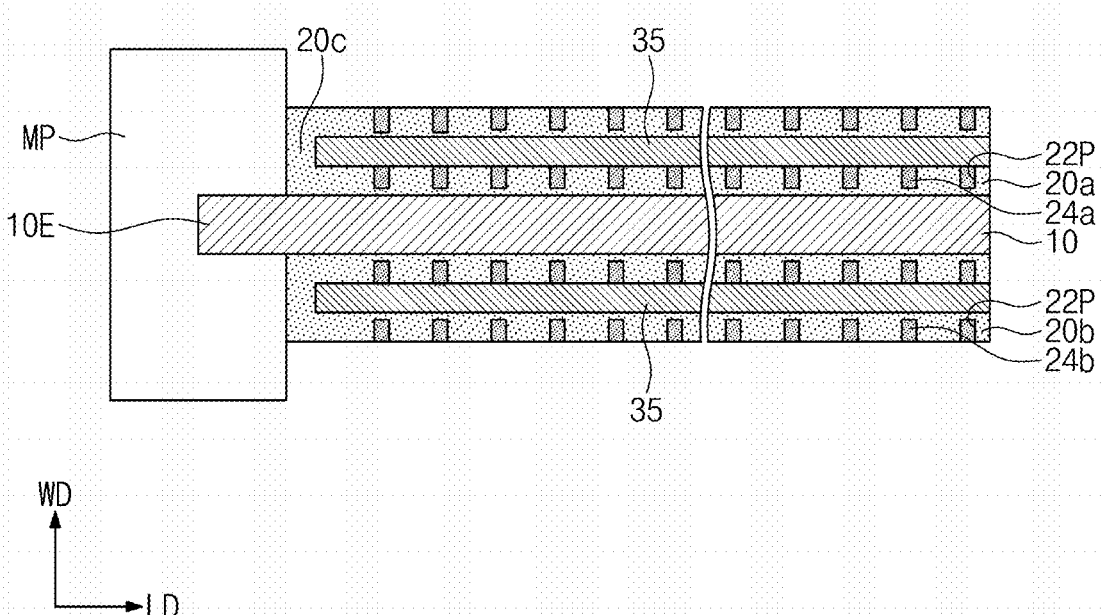

Referring to FIGS. 29 and 31, a first dielectric line 20a may be formed to surround an outer surface 10S of the core electrode line 10. The first dielectric line 20a may have a porous structure having a plurality of holes 22P. First dielectric patterns 24a may be formed to fill the plurality of holes 22P. The first dielectric line 20a and the first dielectric patterns 24a may be formed by substantially the same methods as those used for forming the dielectric line 20 and the dielectric patterns 24 discussed with reference to FIGS. 11 and 14. The connecting dielectric portion 20c may also be formed at this time.

An inner electrode line 35 may be formed to surround an outer surface 20S of the first dielectric line 20a. The inner electrode line 35 may be formed by, for example, physical vapor deposition, chemical vapor deposition, or atomic layer deposition.

A second dielectric line 20b may be formed to surround an outer surface 35S of the inner electrode line 35. The second dielectric line 20b may cover an end of the inner electrode line 35 and may connect to the first dielectric line 20a, for example, through the connecting dielectric portion 20c. The first and second dielectric lines 20a and 20b may be connected through the connecting dielectric portion 20c to constitute a single unitary body. The second dielectric line 20b may have a porous structure having a plurality of holes 22P. Second dielectric patterns 24b may be formed to fill the plurality of holes 22P. The second dielectric line 20b and the second dielectric patterns 24b may be formed by substantially the same methods as those used for forming the dielectric line and the dielectric patterns 24 discussed with reference to FIGS. 11 and 14.

Figure 32:
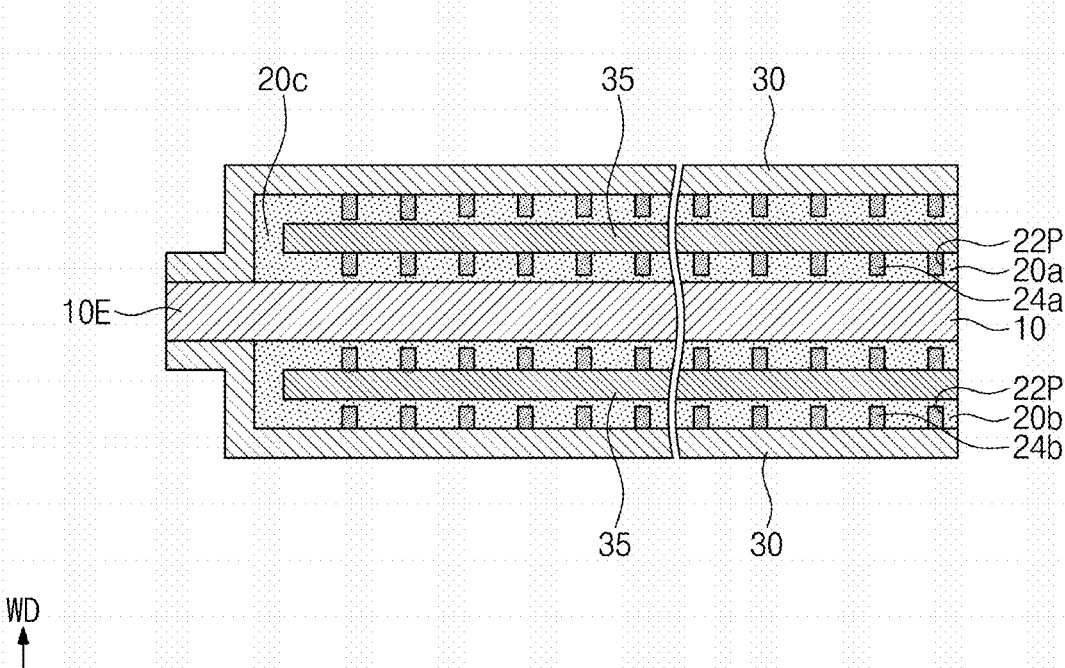

Referring to FIGS. 29 and 32, after the formation of the second dielectric line the mask pattern MP may be removed. Therefore, the end 10E of the core electrode line 10 may be exposed.

An outer electrode line 30 may be formed to surround an outer surface 20bS of the second dielectric line 20b and the end 10E of the core electrode line 10. The outer electrode line 30 may be formed by, for example, physical vapor deposition, chemical vapor deposition, or atomic layer deposition.

Figure 33:
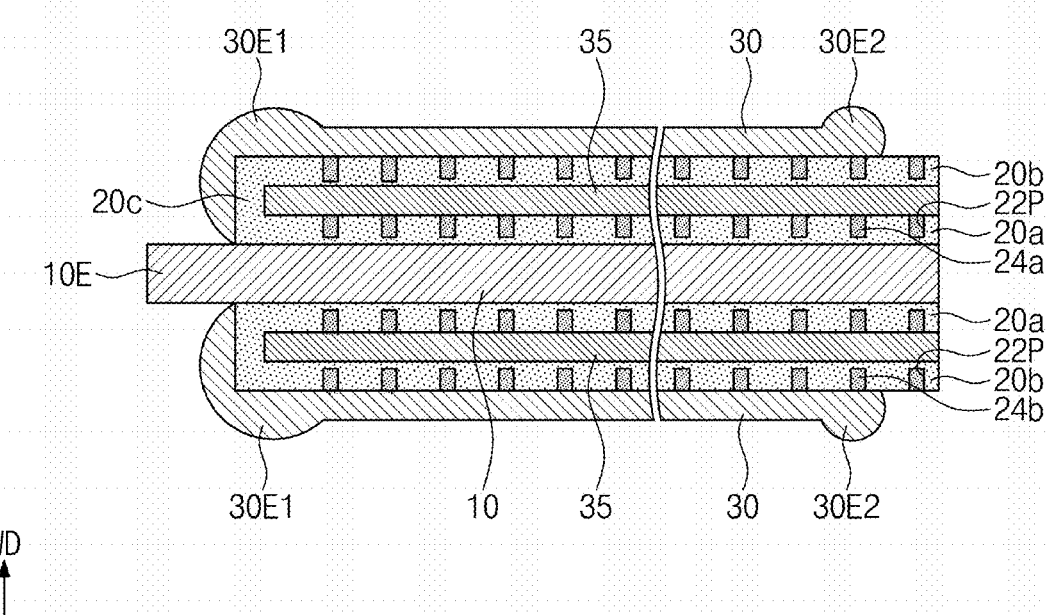

Referring to FIG. 33, a first heating process may be performed on opposite ends 30E1 and 30E2 of the outer electrode line 30. In the first heating process, the ends 30E1 and 30E2 of the outer electrode line 30 may be melted to have their relatively large thicknesses. The ends 30E1 and 30E2 of the outer electrode line 30 may stand opposite to each other in the length direction LD. An end 30E1 of the outer electrode line 30 may have a ring shape that covers ends of the first and second dielectric lines 20a and 20b and surrounds the outer surface 10S of the core electrode line 10. The end 30E1 of the outer electrode line 30 may expose the end 10E of the core electrode line 10. Another end 30E2 of the outer electrode line 30 may have a ring shape that surrounds the outer surface 20bS of the second dielectric line 20b, and may expose an end of the second dielectric line 20b. The first heating process may be performed by using, for example, a laser or an electric spark.

Referring back to FIG. 28, a second heating process may be performed on the exposed end 10E of the core electrode line 10. The second heating process may be performed by using, for example, a laser or an electric spark. The exposed end 10E of the core electrode line 10 may be formed to have a spherical(or ball) shape in the second heating process. Through the method mentioned above, the capacitor wire WCAP of FIG. 28 may be fabricated.

FIGS. 34 to 37 illustrate conceptual views partially showing an electronic device on which is mounted a capacitor wire according to some embodiments of the present inventive concepts.

Referring to FIGS. 34 to 37, an electronic device may include a substrate 100, pads PAD disposed on one surface of the substrate 100, and a capacitor wire WCAP electrically connected to the pads PAD.

The substrate 100 may be a semiconductor chip, a redistribution substrate, or a printed circuit board, and may be, for example, part of a semiconductor device such as semiconductor package. The pads PAD may be electrically connected to internal lines in the substrate 100, and may include or be formed of a conductive material (e.g., metal). The capacitor wire WCAP may be one of the capacitor wires WCAP discussed with reference to FIGS. 1 to 33.

The capacitor wire WCAP may be wire-bonded to the pads PAD. The capacitor wire WCAP may have a first end E1 and a second end E2 that are opposite to each other in a length direction along which the capacitor wire WCAP is elongated. Each of the first and second ends E1 and E2 of the capacitor wire WCAP may be wire-bonded (e.g., ball-bonded or wedge-bonded) to a corresponding one of the pads PAD. The capacitor wire WCAP connected to the pads PAD may have an arch shape.

For example, referring back to FIGS. 2, 5, 6, 19, and 23, on the first end E1 of the capacitor wire WCAP, the end 10E of the core electrode line 10 may be ball-bonded to the corresponding pad PAD, and on the second end E2 of the capacitor wire WCAP, an end of the outer electrode line 30 may be wedge-bonded to the corresponding pad PAD. For another example, referring back to FIGS. 8 to 10, on the first end E1 of the capacitor wire WCAP, the end 10E of the core electrode line 10 may be wedge-bonded to the corresponding pad PAD, and on the second end E2 of the capacitor wire WCAP, an end of the outer electrode line 30 may be wedge-bonded to the corresponding pad PAD. In this case, on the first end E1 of the capacitor wire WCAP, during the wedge-bonding, the end 20E of the dielectric line 20 and/or at least a portion of the oxide layer 32 may be removed to expose the end 10E of the core electrode line 10. For another example, referring back to FIG. 28, on the first end E1 of the capacitor wire WCAP, the end 10E of the core electrode line 10 may be ball-bonded to the corresponding pad PAD, and on the second end E2 of the capacitor wire WCAP, an end of the inner electrode line 35 may be wedge-bonded to the corresponding pad PAD.

Figures 34, 35, 36:
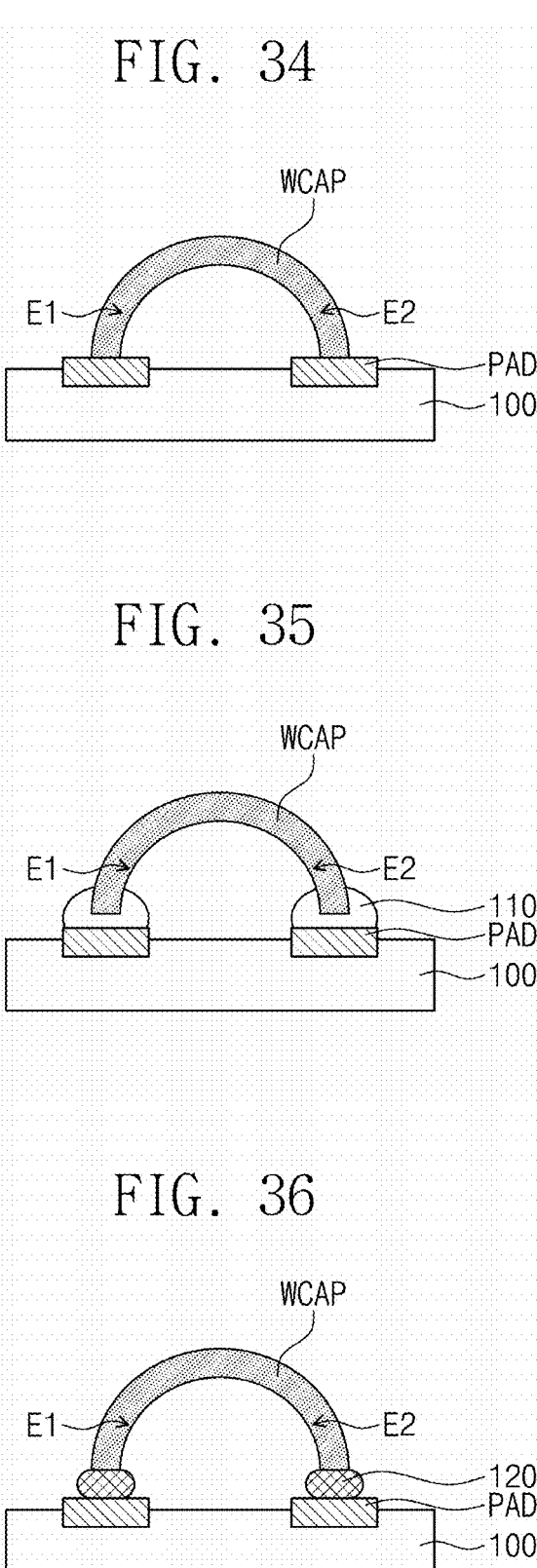
FIGS. 34 to 43 illustrate conceptual views partially showing an electronic device on which is mounted a capacitor wire according to some embodiments of the present inventive concepts.
Figure 37:
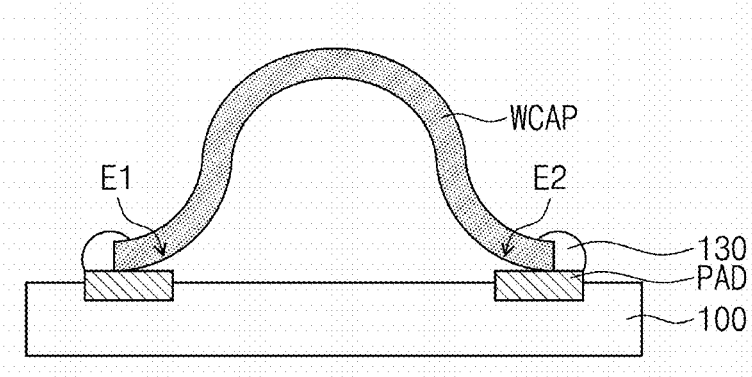

According to some embodiments, as shown in FIG. 34, each of the first and second ends E1 and E2 of the capacitor wire WCAP may contact the corresponding pad PAD. According to some embodiments, as shown in FIG. 35, a solder ball 110 may be interposed between one or both of the first and second ends E1 and E2 of the capacitor wire WCAP and the corresponding pad PAD. The solder ball 110 may include or be formed of a conductive material, such as metal. A portion of one or both of each of the first and second ends E1 and E2 of the capacitor wire WCAP may be inserted into the solder ball 110. According to some embodiments, as shown in FIG. 36, a conductive bump 120 may be interposed between each of the first and second ends E1 and E2 of the capacitor wire WCAP and the corresponding pad PAD. The conductive bump 120 may include or be formed of a conductive material, such as metal. According to some embodiments, as shown in FIG. 37, each of the first and second ends E1 and E2 of the capacitor wire WCAP may contact the corresponding pad PAD, and a reinforcement pattern 130 may be disposed on the corresponding pad PAD. The reinforcement pattern 130 may cover each of the first and second ends E1 and E2 and the corresponding pad PAD. The reinforcement pattern 130 may include or be a conductive material, such as metal.

Figure 38:
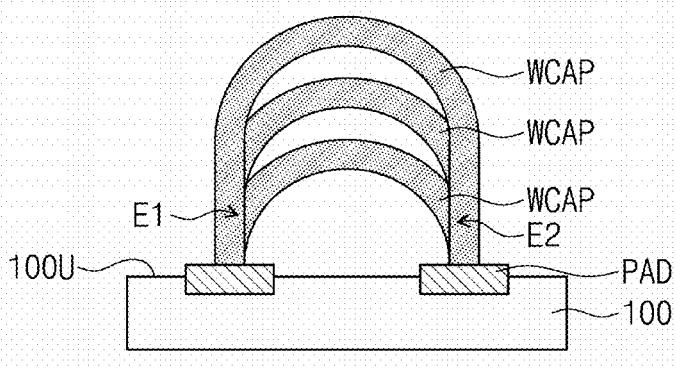
Figure 39:
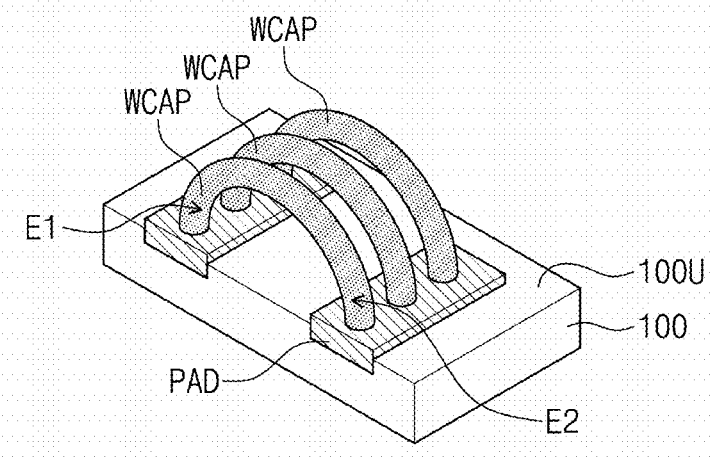
Figure 40:
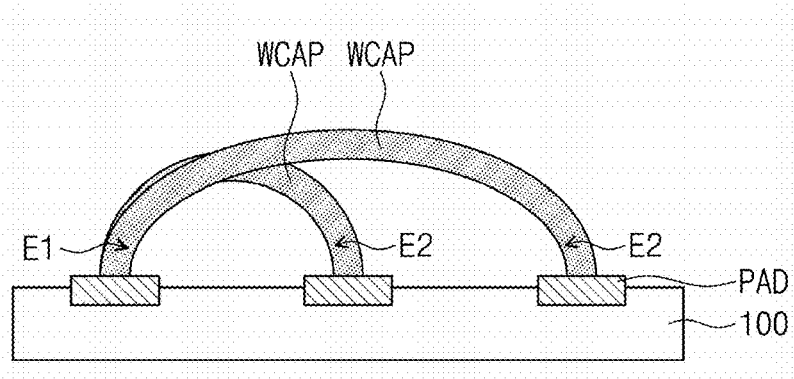

FIGS. 38 to 40 illustrate conceptual views partially showing an electronic device on which is mounted a capacitor wire according to some embodiments of the present inventive concepts. For brevity of description, the following will focus on a difference from the electronic devices discussed with reference to FIGS. 34 to 37.

Referring to FIGS. 38 to 40, an electronic device may include a substrate 100, pads PAD disposed on one surface of the substrate 100, and a plurality of capacitor wires WCAP electrically connected to the pads PAD. The plurality of capacitor wires WCAP may be wire-bonded to the pads PAD. Each of the plurality of capacitor wires WCAP connected to the pads PAD may have an arch shape.

According to some embodiments, as shown in FIG. 38, first ends E1 of the plurality of capacitor wires WCAP may be connected in common to one of the pads PAD, and second ends E2 of the plurality of capacitor wires WCAP may be connected in common to another of the pads PAD. The plurality of capacitor wires WCAP may have different lengths from each other, and may be mounted stacked in a direction perpendicular to a top surface 100U of the substrate 100 on corresponding ones of the pads PAD.

According to some embodiments, as shown in FIG. 39, first ends E1 of the plurality of capacitor wires WCAP may be connected in common to one of the pads PAD, and second ends E2 of the plurality of capacitor wires WCAP may be connected in common to another of the pads PAD. The plurality of capacitor wires WCAP may have the same length as each other, and may be mounted spaced apart from each other in a direction parallel to a top surface 100U of the substrate 100 on corresponding ones of the pads PAD.

According to some embodiments, as shown in FIG. 40, first ends E1 of the plurality of capacitor wires WCAP may be connected in common to one of the pads PAD, and second ends E2 of the plurality of capacitor wires WCAP may be connected to different pads PAD. In this case, a ground voltage may be applied in common to the plurality of capacitor wires WCAP, and different power voltages may be correspondingly applied to the plurality of capacitor wires WCAP.

Figure 41:
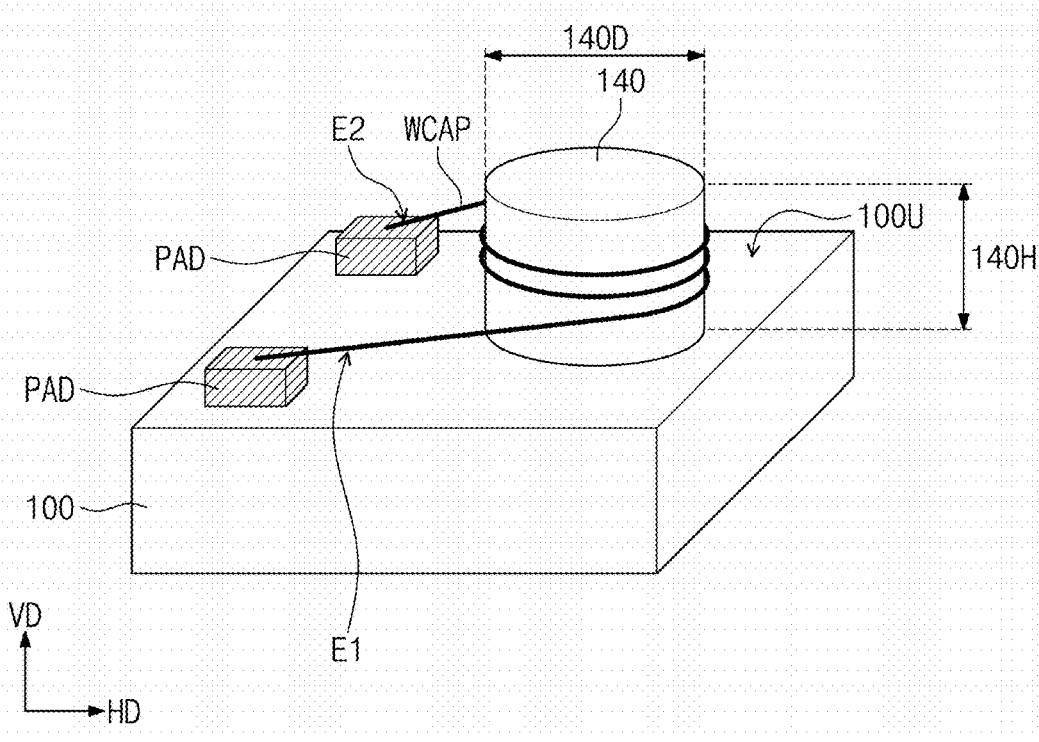
Figures 42, 43:
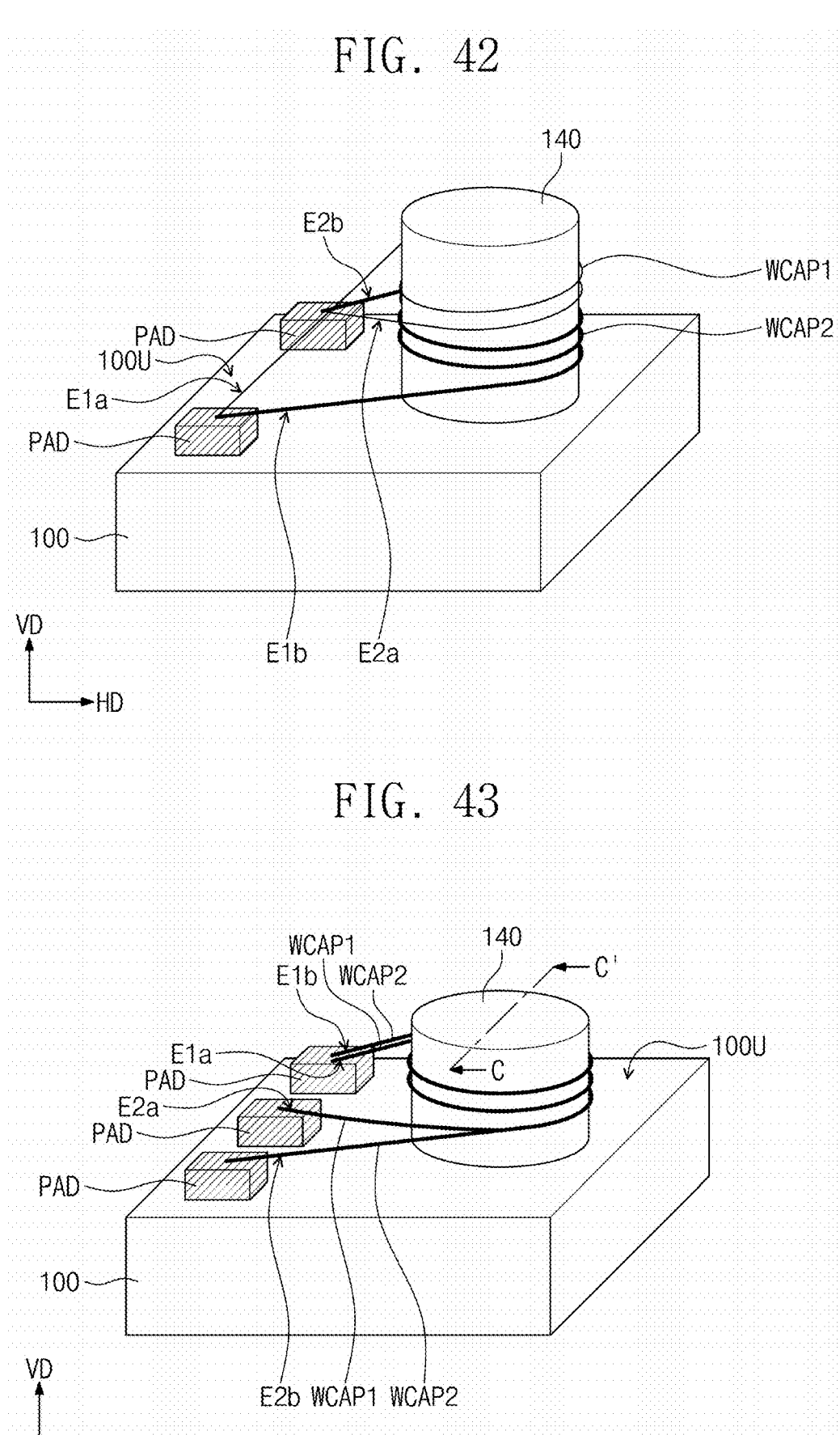

FIGS. 41 and 42 illustrate conceptual views partially showing an electronic device on which is mounted a capacitor wire according to some embodiments of the present inventive concepts.

Referring to FIGS. 41 and 42, an electronic device may include a substrate 100, pads PAD and at least one pillar structure 140 disposed on a top surface 100U of the substrate 100, and at least one capacitor wire WCAP, WCAP1, or WCAP2 that are provided to wind around the pillar structure 140.

The pillar structure 140 may be a dielectric pillar including a dielectric material or a conductive pillar including a conductive material. The pillar structure 140 may have a height 140H in a vertical direction VD perpendicular to the top surface 100U of the substrate 100, and the height 140H of the pillar structure 140 may range, for example, from about 30 μm to about 150 μm. The pillar structure 140 may have a diameter 140D in a horizontal direction HD parallel to the top surface 100U of the substrate 100, and the diameter 140D of the pillar structure 140 may be, for example, about 120 μm. When the pillar structure 140 is provided in plural on the top surface 100U of the substrate 100, the plurality of pillar structures 140 may have therebetween a pitch (e.g., interval) of, for example, about 140 μm.

For example, referring to FIG. 41, the capacitor wire WCAP may be provided to wind around the pillar structure 140. A first end E1 of the capacitor wire WCAP may be connected to one of the pads PAD, and a second end E2 of the capacitor wire WCAP may be connected to another of the pads PAD. According to some embodiments, as the capacitor wire WCAP is provided to wind around the pillar structure 140, the capacitor wire WCAP may have an increased capacitance.

For another example, referring to FIG. 42, a plurality of capacitor wires WCAP1 and WCAP2 may be provided to wind around the pillar structure 140. The pillar structure 140 may be wound around in a clockwise direction with a first capacitor wire WCAP1 of the plurality of capacitor wires WCAP1 and WCAP2 and in a counterclockwise direction with a second capacitor wire WCAP2 of the plurality of capacitor wires WCAP1 and WCAP2. A first end E1a of the first capacitor wire WCAP1 and a first end E1b of the second capacitor wire WCAP2 may be connected in common to one of the pads PAD, and a second end E2a of the first capacitor wire WCAP1 and a second end E2b of the second capacitor wire WCAP2 may be connected in common to another of the pads PAD. According to some embodiments, when the plurality of capacitor wires WCAP1 and WCAP2 are provided to wind around the pillar structure 140 in different directions from each other, inductances between the plurality of capacitor wires WCAP1 and WCAP2 may be counterbalanced.

Figures 44, 45:
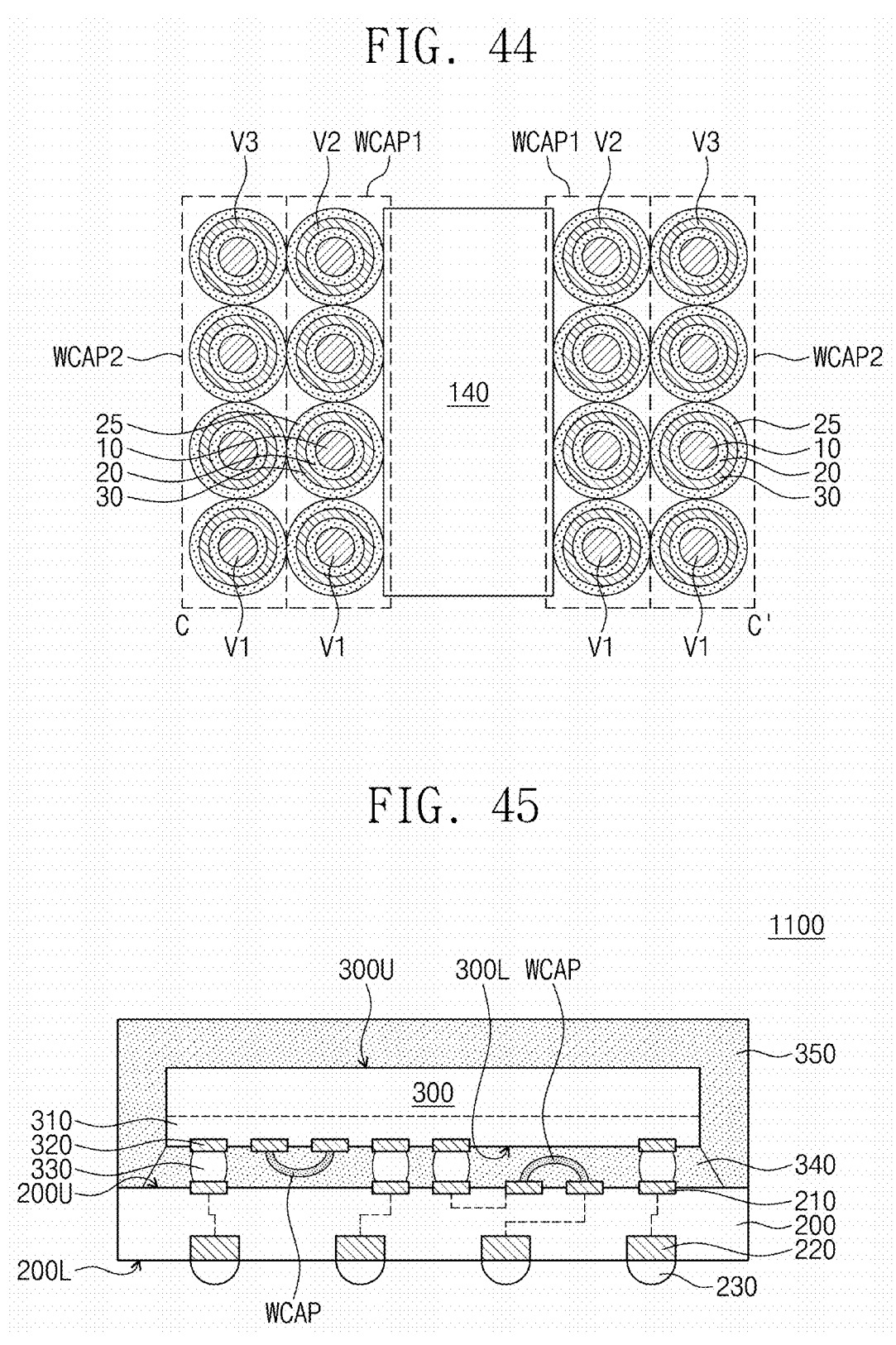
FIG. 44 illustrates a simplified cross-sectional view taken along line C-C' of FIG. 43.
FIGS. 45 to 51 illustrate cross-sectional views showing an electronic device on which is mounted a capacitor wire according to some embodiments of the present inventive concepts.

FIG. 43 illustrates a conceptual view partially showing an electronic device on which is mounted a capacitor wire according to some embodiments of the present inventive concepts. FIG. 44 illustrates a simplified cross-sectional view taken along line C-C' of FIG. 43.

Referring to FIGS. 43 and 44, an electronic device may include a substrate 100, pads PAD and at least one pillar structure 140 disposed on a top surface 100U of the substrate 100, and at least a plurality of capacitor wires WCAP1 and WCAP2 that are provided to wind around the pillar structure 140. The pillar structure 140 may be substantially the same as the pillar structure 140 discussed with reference to FIGS. 41 and 42. According to some embodiments, each of the plurality of capacitor wires WCAP1 and WCAP2 may include, as discussed with reference to FIGS. 1 to 33, the core electrode line 10, the outer electrode line 30, and the dielectric line 20 and the dielectric patterns 24 between the core electrode line 10 and the outer electrode line 30, and may further include an additional dielectric line 25 that surrounds the outer electrode line 30. The additional dielectric line 25 may include a material substantially the same as that of the dielectric line 20.

One of the pads PAD may be connected in common to a first end E1a of a first capacitor wire WCAP1 of the plurality of capacitor wires WCAP1 and WCAP2 and a first end E1b of a second capacitor wire WCAP2 of the plurality of capacitor wires WCAP1 and WCAP2. Therefore, a first voltage V1 may be applied in common to the core electrode line 10 of the first capacitor wire WCAP1 and to the core electrode line 10 of the second capacitor wire WCAP2.

A second end E2a of the first capacitor wire WCAP1 may be connected to another of the pads PAD. In this case, the outer electrode line 30 of the first capacitor wire WCAP1 may be provided with a second voltage V2 different from the first voltage V1, and thus charges may be accumulated in the dielectric line 20 and the dielectric patterns 24 of the first capacitor wire WCAP1. A second end E2b of the second capacitor wire WCAP2 may be connected to still another of the pads PAD. In this case, the outer electrode line 30 of the second capacitor wire WCAP2 may be provided with a third voltage V3 different from the first voltage V1, and thus charges may be accumulated in the dielectric line 20 and the dielectric patterns 24 of the second capacitor wire WCAP2.

According to some embodiments, the second voltage V2 applied to the outer electrode line 30 of the first capacitor wire WCAP1 may be different from the third voltage V3 applied to the outer electrode line 30 of the second capacitor wire WCAP2. In this case, charges may be accumulated in the additional dielectric lines 25 of the first and second capacitor wires WCAP1 and WCAP2. Therefore, the plurality of capacitor wires WCAP1 and WCAP2 may each have an increased capacitance.

FIG. 45 illustrates a cross-sectional view showing an electronic device on which is mounted a capacitor wire according to some embodiments of the present inventive concepts.

Referring to FIG. 45, an electronic device 1100 may include a package substrate 200, first substrate pads 210, second substrate pads 220, external connection terminals 230, a semiconductor chip 300, at least one capacitor wire WCAP, connection bumps 330, an under-fill layer 340, and a chip mold layer 350.

The package substrate 200 may be a printed circuit board, an interposer substrate, or a redistribution substrate, and may have a top surface 200U and a bottom surface 200L that are opposite to each other. The first substrate pads 210 may be disposed on the top surface 200U of the package substrate 200, and the second substrate pads 220 may be disposed on the bottom surface 200L of the package substrate 200. The first substrate pads 210 may be electrically connected to the second substrate pads 220 through internal lines in the package substrate 200. The first and second substrate pads 210 and 220 may include or be formed of a conductive material, such as metal. The external connection terminals 230 may be disposed on the bottom surface 200L of the package substrate 200, and may be correspondingly located on the second substrate pads 220. The external connection terminals 230 may be electrically connected to the second substrate pads 220. The external connection terminals 230 may include at least one selected from pillars, bumps, and solder balls, and may be formed of a conductive material.

The semiconductor chip 300 may be mounted on the top surface 200U of the package substrate 200. The semiconductor chip 300 may be a memory chip, a logic chip, an application processor (AP) chip, or a system-on-chip (SOC), for example, and may have a top surface 300U and a bottom surface 300L that are opposite to each other. The semiconductor chip 300 may include a circuit layer 310 adjacent to the bottom surface 300L of the semiconductor chip 300 and chip pads 320 disposed on the bottom surface 300L of the semiconductor chip 300. The chip pads 320 may be electrically connected to the circuit layer 310. The semiconductor chip 300 may be placed to allow the bottom surface 300L of the semiconductor chip 300 to face the top surface 200U of the package substrate 200.

The connection bumps 330 may be disposed between and electrically connect the semiconductor chip 300 and the package substrate 200. The connection bumps 330 may be disposed on and electrically connected to corresponding ones of the chip pads 320. The connection bumps 330 may be disposed on and electrically connected to corresponding ones of the first substrate pads 210. The semiconductor chip 300 may be electrically connected to the package substrate 200 through the connection bumps 330, the corresponding chip pads 320, and the corresponding first substrate pads 210. The connection bumps 330 may include at least one selected from pillars, bumps, and solder balls, and may be formed of a conductive material.

The at least one capacitor wire WCAP may be disposed between the semiconductor chip 300 and the package substrate 200. For example, at least one capacitor wire WCAP may be disposed below the semiconductor chip 300, and may be connected to corresponding ones of the first substrate pads 210. For another example, the at least one capacitor wire WCAP may be disposed on the bottom surface 300L of the semiconductor chip 300 and may be connected to corresponding ones of the chip pads 320. As discussed with reference to FIGS. 34 to 40, the at least one capacitor wire WCAP may be wire-bonded to the corresponding first substrate pads 210 or the corresponding chip pads 320. An arch shape may be given to the at least one capacitor wire WCAP connected to the corresponding first substrate pads 210 or the corresponding chip pads 320.

According to some embodiments, the at least one pillar structure 140 discussed with reference to FIGS. 41 to 44 may be provided either on the top surface 200U of the package substrate 200 or on the bottom surface 300L of the semiconductor chip 300, and the at least one capacitor wire WCAP may be provided to wind around the at least one pillar structure 140.

The under-fill layer 340 may fill a space between the semiconductor chip 300 and the package substrate 200, and may cover the connection bumps 330 and the at least one capacitor wire WCAP. The under-fill layer 340 may include or be formed of a dielectric polymeric material, such as epoxy resin.

The chip mold layer 350 may be disposed on the top surface 200U of the package substrate 200, and may encapsulate the semiconductor chip 300. The chip mold layer 350 may cover the semiconductor chip 300 and the under-fill layer 340, and may contact the top surface 200U of the package substrate 200. The chip mold layer 350 may include or be formed of a dielectric material, such as an epoxy molding compound.

The electronic device 1100 may be a semiconductor package that includes the semiconductor chip 300 mounted on the package substrate 200.

Figure 46:
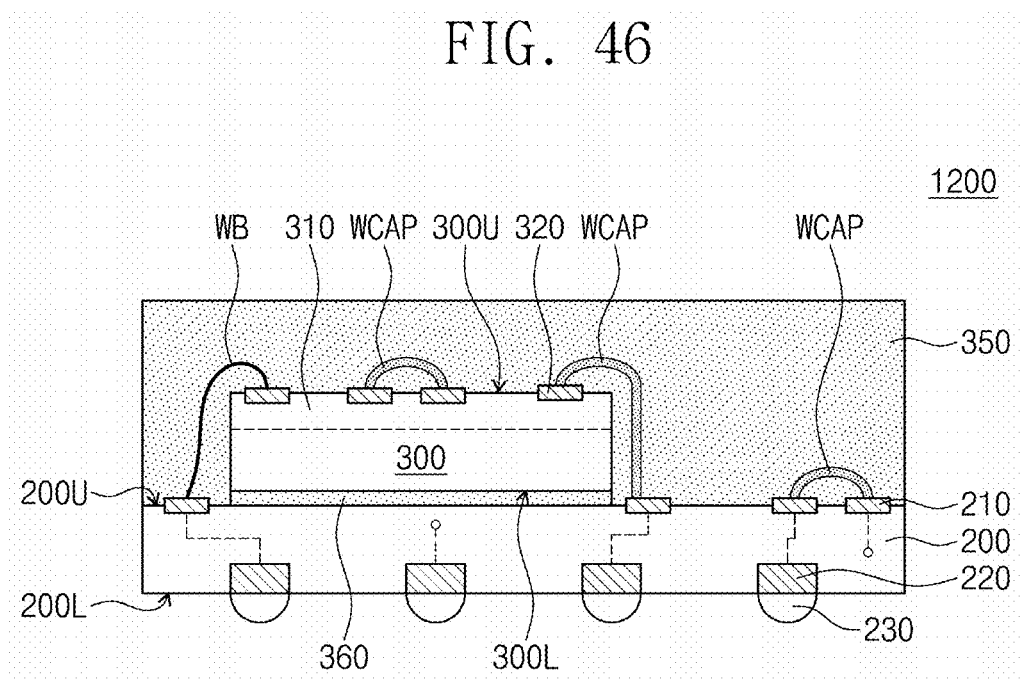

FIG. 46 illustrates a cross-sectional view showing an electronic device on which is mounted a capacitor wire according to some embodiments of the present inventive concepts. For brevity of description, the following will focus on a difference from the electronic device discussed with reference to FIG. 45.

Referring to FIG. 46, an electronic device 1200 may include a package substrate 200, first substrate pads 210, second substrate pads 220, external connection terminals 230, a semiconductor chip 300, at least one capacitor wire WCAP, an adhesion layer 360, and a chip mold layer 350.

The package substrate 200, the first substrate pads 210, the second substrate pads 220, and the external connection terminals 230 may be substantially the same as the package substrate 200, the first substrate pads 210, the second substrate pads 220, and the external connection terminals 230 discussed with reference to FIG. 45.

The semiconductor chip 300 may be mounted on a top surface 200U of the package substrate 200. The semiconductor chip 300 may be a memory chip, a logic chip, an application processor (AP) chip, or a system-on-chip (SOC), for example, and may have a top surface 300U and a bottom surface 300L that are opposite to each other. The semiconductor chip 300 may include a circuit layer 310 adjacent to the top surface 300U of the semiconductor chip 300 and chip pads 320 disposed on the top surface 300U of the semiconductor chip 300. The chip pads 320 may be electrically connected to the circuit layer 310. The semiconductor chip 300 may be disposed to allow the bottom surface 300L of the semiconductor chip 300 to face the top surface 200U of the package substrate 200.

The adhesion layer 360 may be disposed between the semiconductor chip 300 and the package substrate 200. The adhesion layer 360 may be in contact with the bottom surface 300L of the semiconductor chip 300 and the top surface 200U of the package substrate 200. The semiconductor chip 300 may be attached through the adhesion layer 360 to the package substrate 200. The adhesion layer 360 may include or be formed of, for example, an organic dielectric material.

A conductive wire WB may be electrically connected to one of the chip pads 320 of the semiconductor chip 300 and one of the first substrate pads 210 of the package substrate 200. The semiconductor chip 300 may be electrically connected through the conductive wire WB to the package substrate 200.

The at least one capacitor wire WCAP may be mounted on the semiconductor chip 300 or the package substrate 200. For example, the at least one capacitor wire WCAP may be disposed on the top surface 300U of the semiconductor chip 300 and may be connected to corresponding ones of the chip pads 320. For another example, an end of the at least one capacitor wire WCAP may be connected to a corresponding one of the chip pads 320 of the semiconductor chip 300, and another end of the at least one capacitor wire WCAP may be connected to a corresponding one of the first substrate pads 210 of the package substrate 200. For another example, on the package substrate 200, the at least one capacitor wire WCAP may be disposed spaced apart from the semiconductor chip 300. The at least one capacitor wire WCAP may be connected to corresponding ones of the first substrate pads 210. As discussed with reference to FIGS. 34 to 40, the at least one capacitor wire WCAP may be wire-bonded to the corresponding first substrate pads 210 or the corresponding chip pads 320. An arch shape may be given to the at least one capacitor wire WCAP connected to the corresponding first substrate pads 210 or the corresponding chip pads 320. According to some embodiments, the at least one pillar structure 140 discussed with reference to FIGS. 41 to 44 may be provided either on the top surface 200U of the package substrate 200 or on the top surface 300U of the semiconductor chip 300, and the at least one capacitor wire WCAP may be provided to wind around the at least one pillar structure 140.

The chip mold layer 350 may be disposed on the top surface 200U of the package substrate 200, and may encapsulate the semiconductor chip 300. The chip mold layer 350 may cover the semiconductor chip 300, the at least one capacitor wire WCAP, and the conductive wire WB, and may contact the top surface 200U of the package substrate 200. The chip mold layer 350 may include a dielectric material, such as an epoxy molding compound.

The electronic device 1200 may be a semiconductor package that includes the semiconductor chip 300 mounted on the package substrate 200.

Figure 47:
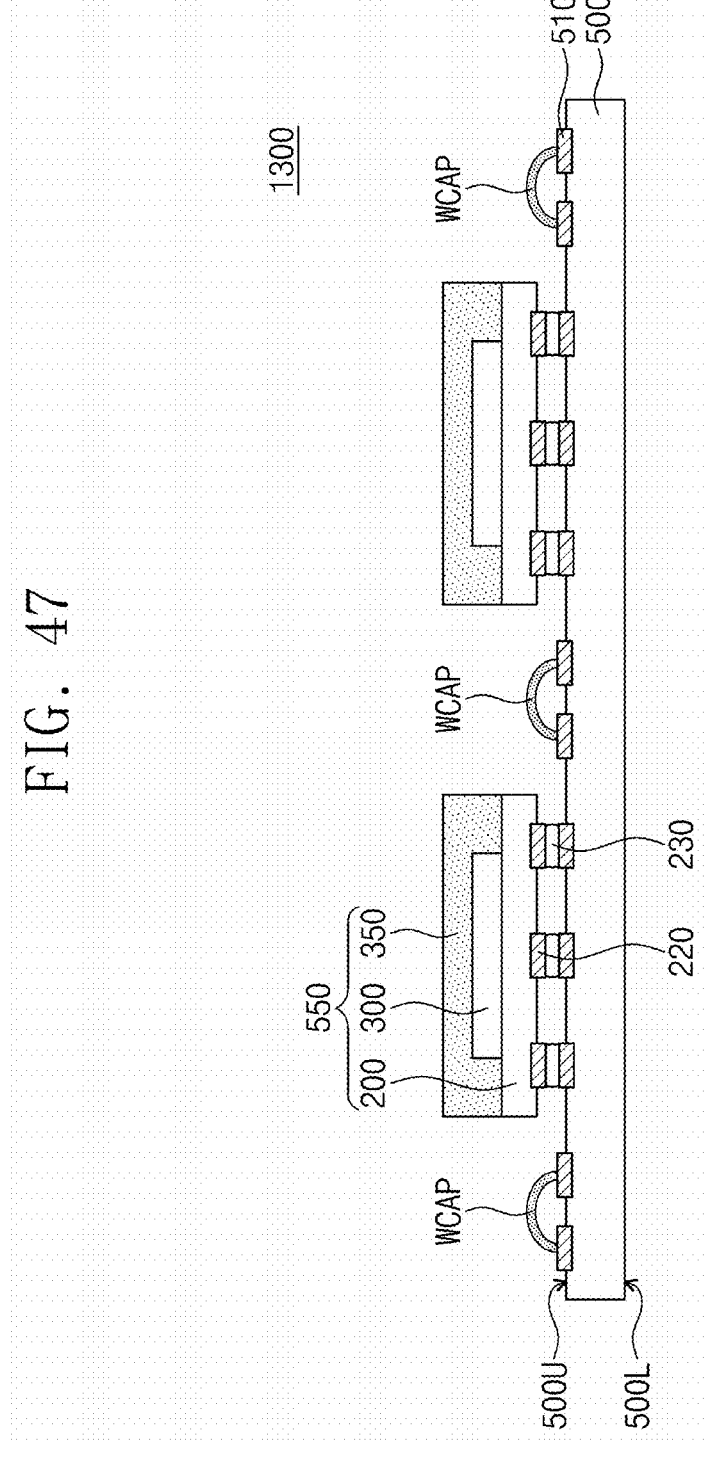

FIG. 47 illustrates a cross-sectional view showing an electronic device on which is mounted a capacitor wire according to some embodiments of the present inventive concepts.

Referring to FIG. 47, an electronic device 1300 may include a module substrate 500, module substrate pads 510, semiconductor packages 550, and at least one capacitor wire WCAP.

The module substrate 500 may be a printed circuit board and have a top surface 500U and a bottom surface 500L that are opposite to each other. The module substrate pads 510 may be disposed on the top surface 500U of the module substrate 500 and electrically connected to internal lines in the module substrate 500. The module substrate pads 510 may include or be formed of a conductive material, such as metal.

The semiconductor packages 550 may be disposed on the top surface 500U of the module substrate 500 and horizontally spaced apart from each other. Each of the semiconductor packages 550 may include a package substrate 200, a semiconductor chip 300, and a chip mold layer 350. The package substrate 200, the semiconductor chip 300, and the chip mold layer 350 may be substantially the same as the package substrate 200, the semiconductor chip 300, and the chip mold layer 350 discussed with reference to FIGS. 41 and 42. Each of the semiconductor packages 550 may be configured substantially identically to one or more of the electronic devices 1100 and 1200 discussed with reference to FIGS. 41 and 42. Substrate pads 220 may be disposed on a bottom surface of the package substrate 200, and connection terminals 230 may be electrically connected to the substrate pads 220. The substrate pads 220 and the connection terminals 230 may be substantially the same as the second substrate pads 220 and the external connection terminals 230 discussed with reference to FIGS. 41 and 42. The connection terminals 230 may be electrically connected to corresponding ones of the module substrate pads 510. Each of the semiconductor packages 550 may be electrically connected through the substrate pads 220, the connection terminals 230, and the corresponding module substrate pads 510 to internal lines in the module substrate 500. The semiconductor chip 300 in each of the semiconductor packages 550 may be electrically connected through the package substrate 200, the substrate pads 220, the connection terminals 230, and the corresponding module substrate pads 510 to internal lines in the module substrate 500.

The at least one capacitor wire WCAP may be disposed on the top surface 500U of the module substrate 500 and may be connected to corresponding ones of the module substrate pads 510. The at least one capacitor wire WCAP may be horizontally spaced apart from the semiconductor packages 550 on the top surface 500U of the module substrate 500. As discussed with reference to FIGS. 34 to 40, the at least one capacitor wire WCAP may be wire-bonded to the corresponding module substrate pads 510. An arch shape may be given to the at least one capacitor wire WCAP connected to the corresponding module substrate pads 510. The at least one capacitor wire WCAP may be electrically connected through the corresponding module substrate pads 510 to internal lines in the module substrate 500. The at least one capacitor wire WCAP may be electrically connected to the semiconductor packages 550 through internal lines in the module substrate 500. According to some embodiments, the at least one pillar structure 140 discussed with reference to FIGS. 41 to 44 may be provided on the top surface 500U of the module substrate 500, and the at least one capacitor wire WCAP may be provided to wind around the at least one pillar structure 140.

The electronic device 1300 may be a semiconductor module including semiconductor packages 550 mounted on the module substrate 500. Although not shown, the electronic device 1300 may further include an encapsulation layer that is disposed on the module substrate 500 and covers the semiconductor packages 550 and the at least one capacitor wire WCAP.

Figure 48:
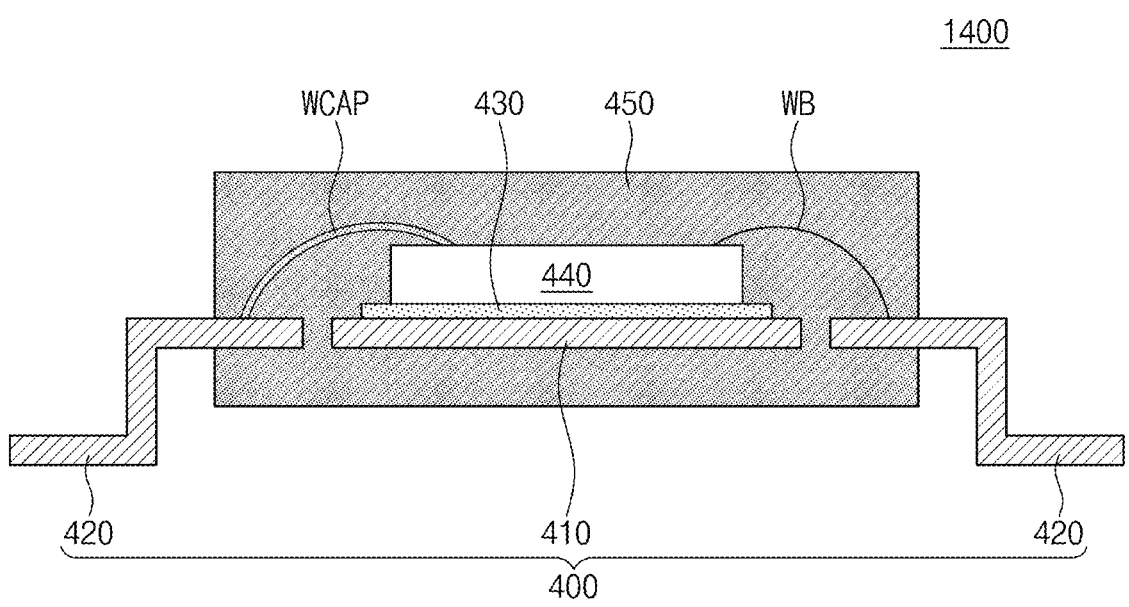

FIG. 48 illustrates a cross-sectional view showing an electronic device on which is mounted a capacitor wire according to some embodiments of the present inventive concepts.

Referring to FIG. 48, an electronic device 1400 may include a lead frame 400, a semiconductor chip 440 mounted on the lead frame 400, a chip adhesion layer 430 between the lead frame 400 and the semiconductor chip 440, a conductive wire WB, at least one capacitor wire WCAP, and a mold layer 450.

The lead frame 400 may include a support substrate 410 on which the semiconductor chip 440 is provided, and may also include a plurality of leads 420. The support substrate 410 and the plurality of leads 420 may include or be formed of a metallic material. The semiconductor chip 440 may be provided on the support substrate 410, and the chip adhesion layer 430 may be interposed between the semiconductor chip 440 and the support substrate 410. The semiconductor chip 440 may be attached through the chip adhesion layer 430 to the support substrate 410. The semiconductor chip 440 may be, for example, a memory chip, a logic chip, an application processor (AP) chip, or a system-on-chip (SOC). The chip adhesion layer 430 may include or be formed of, for example, an organic dielectric material.

The conductive wire WB may electrically connect the semiconductor chip 440 to a corresponding one of the plurality of leads 420. The semiconductor chip 440 may be electrically connected through the conductive wire WB to the lead frame 400. The at least one capacitor wire WCAP may electrically connect the semiconductor chip 440 to a corresponding one of the plurality of leads 420.

The mold layer 450 may encapsulate the support substrate 410, the semiconductor chip 440, the chip adhesion layer 430, the conductive wire WB, and the at least one capacitor wire WCAP, and may cover ends of the plurality of leads 420. Other ends of the plurality of leads 420 may be exposed outwardly from the mold layer 450 and may be connected to external terminals. The mold layer 450 may include a dielectric material, such as an epoxy molding compound.

The electronic device 1400 may be a semiconductor package including the semiconductor chip 440 mounted on the lead frame 400.

Figure 49:
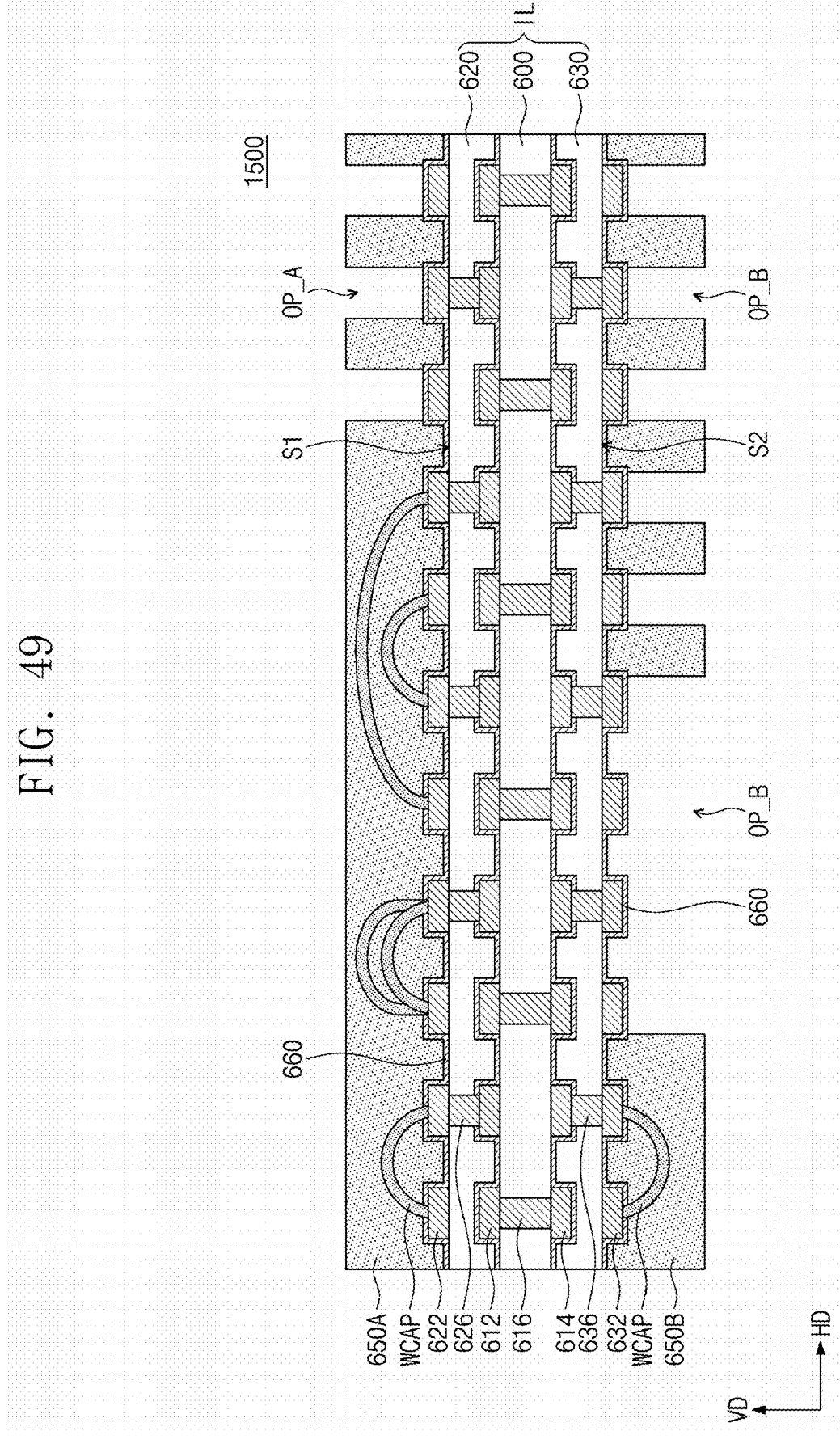

FIG. 49 illustrates a cross-sectional view showing an electronic device on which is mounted a capacitor wire according to some embodiments of the present inventive concepts.

Referring to FIG. 49, an electronic device 1500 may include a dielectric layer IL having a first surface S1 and a second surface S2 that are opposite to each other, upper wiring patterns 622 on the first surface S1 of the dielectric layer IL, lower wiring patterns 632 on the second surface S2 of the dielectric layer IL, and intermediate wiring patterns 612 and 614 that are disposed in the dielectric layer IL and are electrically connected to the upper wiring patterns 622 and the lower wiring patterns 632.

The dielectric layer IL may include an upper dielectric layer 620 adjacent to the first surface S1, a lower dielectric layer 630 adjacent to the second surface S2, and an intermediate layer 600 between the upper dielectric layer 620 and the lower dielectric layer 630. Each of the upper and lower dielectric layers 620 and 630 may include or be formed of a dielectric polymeric material, and may further include or be a glass fiber. According to some embodiments, the intermediate layer 600 may include or be a core substrate. For example, the core substrate may include or be formed of a dielectric polymeric material, and may further include or be formed of a glass fiber. For another example, the core substrate may include or be formed of metal (e.g., copper, aluminum, etc.). According to some embodiments, the intermediate layer 600 may include a plurality of intermediate dielectric layers that are stacked in a vertical direction VD perpendicular to the first surface S1 between the upper dielectric layer 620 and the lower dielectric layer 630, and may also include the core substrate interposed between the plurality of intermediate dielectric layers. In this case, each of the plurality of intermediate dielectric layers may include or be formed of a dielectric polymeric material, and may further include or be formed of a glass fiber.

The upper wiring patterns 622 may be disposed on the first surface S1 of the dielectric layer IL and on the upper dielectric layer 620. The upper wiring patterns 622 may include or be formed of metal (e.g., copper). The lower wiring patterns 632 may be disposed on the second surface S2 of the dielectric layer IL and on the lower dielectric layer 630. The lower wiring patterns 632 may include or be formed of metal (e.g., copper). The intermediate wiring patterns 612 and 614 may include first intermediate wiring patterns 612 disposed between the intermediate layer 600 and the upper dielectric layer 620, and may also include second intermediate wiring patterns 614 disposed between the intermediate layer 600 and the lower dielectric layer 630. The intermediate wiring patterns 612 and 614 may include or be formed of metal (e.g., copper).

The electronic device 1500 may further include upper vias 626 that are disposed in the upper dielectric layer 620 and electrically connect the upper wiring patterns 622 to the first intermediate wiring patterns 612, lower vias 636 that are disposed in the lower dielectric layer 630 and electrically connect the lower wiring patterns 632 to the second intermediate wiring patterns 614, and intermediate vias 616 that are disposed in the intermediate layer 600 and electrically connect the first intermediate wiring patterns 612 to the second intermediate wiring patterns 614. The electronic device 1500 may further include additional intermediate wiring patterns disposed in the intermediate layer 600 and additional intermediate vias that electrically connect the additional intermediate wiring patterns to each other. The upper, lower, and intermediate vias 626, 636, and 616 may include or be formed of metal (e.g., copper).

The electronic device 1500 may further include a capacitor wire WCAP electrically connected to corresponding ones of the upper, lower, and intermediate wiring patterns 622, 632, 612, and 614. The capacitor wire WCAP may be wire-bonded to the corresponding wiring patterns 622, 632, 612, and 614. The capacitor wire WCAP may be one of the capacitor wires WCAP discussed with reference to FIGS. 1 to 33. On the first end E1 of the capacitor wire WCAP, the end 10E of the core electrode line 10 may be ball-bonded or wedge-bonded to one of the corresponding wiring patterns 622, 632, 612, and 614. On the second end E2 of the capacitor wire WCAP, an end of the outer electrode line 30 may be wedge-bonded to another of the corresponding wiring patterns 622, 632, 612, and 614.

For example, the capacitor wire WCAP may be disposed on the first surface S1 of the dielectric layer IL and may be connected to corresponding ones of the upper wiring patterns 622. On the first end E1 of the capacitor wire WCAP, the core electrode line 10 may be ball-bonded or wedge-bonded to one of the corresponding upper wiring patterns 622, and on the second end E2 of the capacitor wire WCAP, the outer electrode line 30 may be wedge-bonded to another of the corresponding upper wiring patterns 622. For example, the capacitor wire WCAP may be disposed on the second surface S2 of the dielectric layer IL and may be connected to corresponding ones of the lower wiring patterns 632. On the first end E1 of the capacitor wire WCAP, the core electrode line 10 may be ball-bonded or wedge-bonded to one of the corresponding lower wiring patterns 632, and on the second end E2 of the capacitor wire WCAP, the outer electrode line 30 may be wedge-bonded to another of the corresponding lower wiring patterns 632.

The electronic device 1500 may further include an upper mask layer 650A that is disposed on the first surface S1 of the dielectric layer IL and covers the upper wiring patterns 622 and a lower mask layer 650B that is disposed on the second surface S2 of the dielectric layer IL and covers the lower wiring patterns 632. Each of the upper and lower mask layers 650A and 650B may be a solder mask or a solder resist, and may include a dielectric material. The upper mask layer 650A may be provided therein with the capacitor wire WCAP connected to the corresponding upper wiring patterns 622, and the lower mask layer 650B may be provided therein with the capacitor wire WCAP connected to the corresponding lower wiring patterns 632.

The electronic device 1500 may further include a protection layer 660 that covers surfaces of the upper, lower, and intermediate wiring patterns 622, 632, 612, and 614. The protection layer 660 may include or be formed of metal oxide (e.g., aluminum oxide) and may prevent oxidation of the surfaces of the upper, lower, and intermediate wiring patterns 622, 632, 612, and 614.

The protection layer 660, which covers the surfaces of the upper wiring patterns 622, may be interposed between the upper wiring patterns 622 and the upper mask layer 650A, and may extend between the upper dielectric layer 620 and the upper mask layer 650A. The capacitor wire WCAP may penetrate the protection layer 660 to come into connection with the corresponding upper wiring patterns 622. The protection layer 660, which covers the surfaces of the lower wiring patterns 632, may be interposed between the lower wiring patterns 632 and the lower mask layer 650B, and may extend between the lower dielectric layer 630 and the lower mask layer 650B. The capacitor wire WCAP may penetrate the protection layer 660 to come into connection with the corresponding lower wiring patterns 632. According to some embodiments, the protection layer 660 may be omitted.

The upper mask layer 650A may include upper openings OP_A. The upper openings OP_A may overlap vertically (e.g., in the vertical direction VD) with corresponding ones of the upper wiring patterns 622, and may expose the protection layer 660 on the corresponding upper wiring patterns 622. The lower mask layer 650B may include lower openings OP_B. The lower openings OP_B may overlap vertically (e.g., in the vertical direction VD) with corresponding ones of the lower wiring patterns 632, and may expose the protection layer 660 on the corresponding lower wiring patterns 632. According to some embodiments, the protection layer 660 may be omitted, and in this case, the upper openings OP_A may expose the corresponding upper wiring patterns 622, and the lower openings OP_B may exposed the corresponding lower wiring patterns 632.

The electronic device 1500 may be an embedded wiring substrate, such as an embedded printed circuit board, in which the at least one capacitor wire WCAP is buried.

Figures 50, 51:
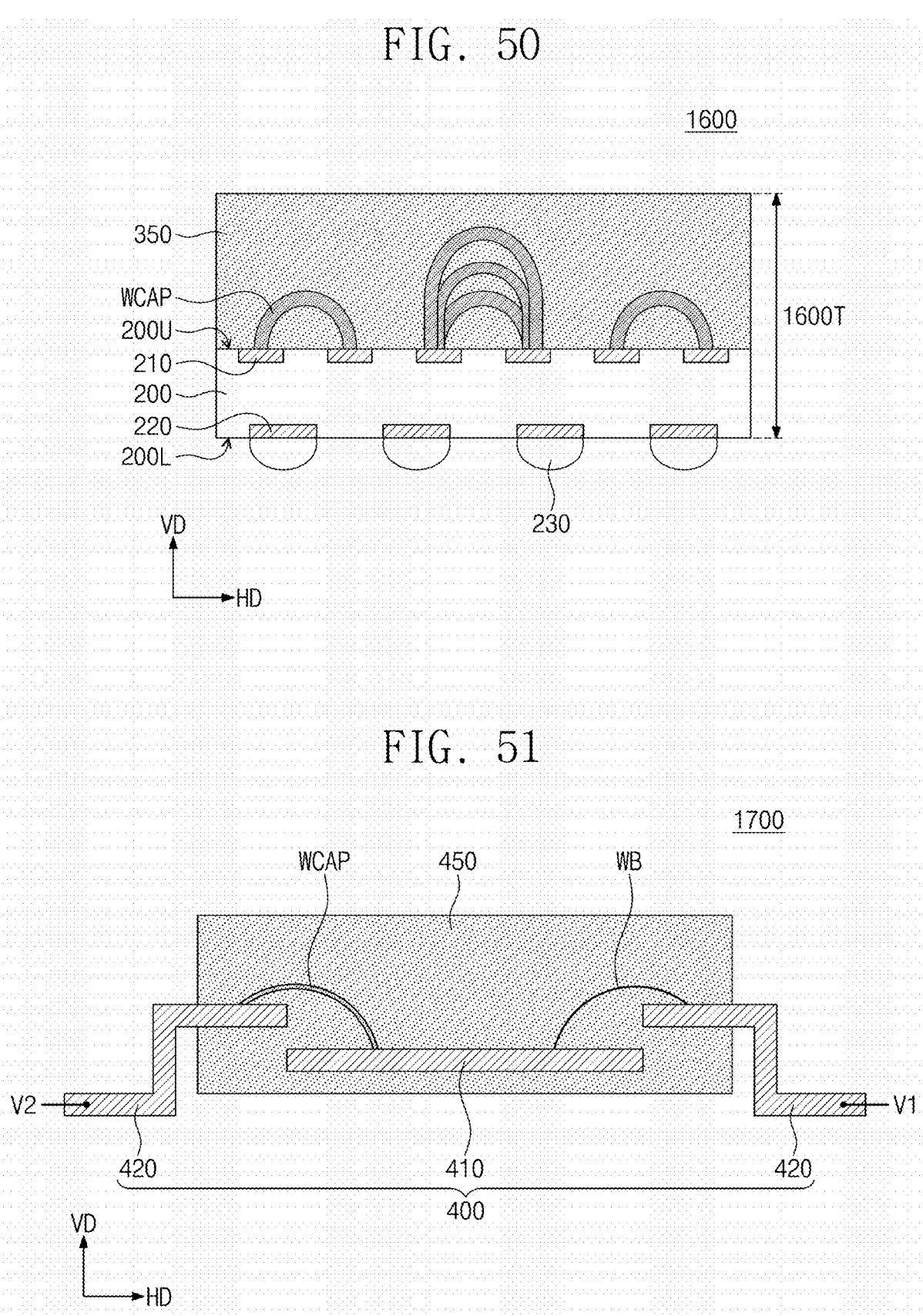

FIG. 50 illustrates a cross-sectional view showing an electronic device on which is mounted a capacitor wire according to some embodiments of the present inventive concepts.

Referring to FIG. 50, an electronic device 1600 may include a package substrate 200, first substrate pads 210, second substrate pads 220, external connection terminals 230, a plurality of capacitor wires WCAP, and a chip mold layer 350.

The package substrate 200, the first substrate pads 210, the second substrate pads 220, and the external connection terminals 230 may be substantially the same as the package substrate 200, the first substrate pads 210, the second substrate pads 220, and the external connection terminals 230 discussed with reference to FIG. 45.

The plurality of capacitor wires WCAP may be mounted on the top surface 200U of the package substrate 200 and may be electrically connected to the first substrate pads 210. Each of the plurality of capacitor wires WCAP may be wire-bonded to corresponding ones of the first substrate pads 210. On the package substrate 200, some of the plurality of capacitor wires WCAP may be mounted spaced apart from each other along a horizontal direction HD parallel to the top surface 200U of the package substrate 200, and others of the plurality of capacitor wires WCAP may be mounted stacked along a vertical direction VD perpendicular to the top surface 200U of the package substrate 200. As discussed with reference to FIGS. 34 to 40, each of the plurality of capacitor wires WCAP may be wire-bonded to the corresponding first substrate pads 210. An arch shape may be given to each of the plurality of capacitor wires WCAP connected to the corresponding first substrate pads 210. According to some embodiments, the at least one pillar structure 140 discussed with reference to FIGS. 41 to 44 may be provided on the top surface 200U of the package substrate 200, and at least one of the plurality of capacitor wires WCAP may be provided to wind around the at least one pillar structure 140.

The chip mold layer 350 may be disposed on the top surface 200U of the package substrate 200, and may encapsulate the plurality of capacitor wires WCAP. The chip mold layer 350 may include a dielectric material, such as an epoxy molding compound.

The electronic device 1600 may be a chip capacitor including the plurality of capacitor wires WCAP mounted on the package substrate 200. The chip capacitor may indicate a chip-shaped capacitor in which the plurality of capacitor wires WCAP are embedded. The electronic device 1600 may have a thickness 1600T in the vertical direction VD, and the thickness 1600T of the electronic device 1600 may be, for example, equal to or less than about 1 mm. The electronic device 1600 may be electrically connected to external terminals through the external connection terminals 230 and the second substrate pads 220 of the package substrate 200.

FIG. 51 illustrates a cross-sectional view showing an electronic device on which is mounted a capacitor wire according to some embodiments of the present inventive concepts.

Referring to FIG. 51, an electronic device 1700 may include a lead frame 400, a conductive wire WB and a plurality of capacitor wires WCAP mounted on the lead frame 400, and a mold layer 450.

The lead frame 400 may include a support substrate 410 and a plurality of leads 420. The support substrate 410 and the plurality of leads 420 may include a metallic material. The conductive wire WB may electrically connect the support substrate 410 to one of the plurality of leads 420. A first voltage V1 may be applied to the support substrate 410 through the conductive wire WB and the one of the plurality of leads 420.

Each of the plurality of capacitor wires WCAP may be electrically connected to the support substrate 410 and a corresponding one of the plurality of leads 420, and may be wire-bonded to the support substrate 410 and the corresponding lead 420. The first voltage V1 may be applied through the support substrate 410 to the outer electrode line 30 (or the core electrode line 10) of each of the plurality of capacitor wires WCAP. A second voltage V2, which is different from the first voltage V1, may be applied through the corresponding lead 420 to the core electrode line 10 (or the outer electrode line 30) of each of the plurality of capacitor wires WCAP.

The mold layer 450 may encapsulate the support substrate 410, the plurality of capacitor wires WCAP, and the conductive wire WB, and may cover ends of the plurality of leads 420. Other ends of the plurality of leads 420 may be exposed outwardly from the mold layer 450 and may be connected to external terminals.

The electronic device 1700 may be a chip capacitor including the plurality of capacitor wires WCAP mounted on the lead frame 400.

According to the present inventive concepts, as the capacitor wire WCAP has a wire shape, the capacitor wire WCAP may easily become compact-sized. Thus, the capacitor wire WCAP can take up less area and/or volume than a typical capacitor, and can be more easily fit into different locations on an electronic device. In addition, as the capacitor wire WCAP is wire-bonded to the corresponding pads PAD, 210, 320, and 501, the corresponding leads 420, or the corresponding wiring patterns 622, 632, 612, and 614, the capacitor wire WCAP may be easily mounted on the electronic devices 1100 to 1700. Accordingly, the electronic devices 1100 to 1700 may easily become compact-sized and highly integrated.

According to the present inventive concepts, as a capacitor wire has a wire shape, the capacitor wire may easily become compact-sized. The capacitor wire may include a dielectric line having a porous structure. When the capacitor wire includes dielectric patterns that fill a plurality holes in the dielectric line, the dielectric patterns may include a material whose permittivity is greater than that of the dielectric line, and thus the capacitor may have an increased capacitance. When the capacitor wire includes an outer electrode line that extends into the plurality of holes in the dielectric line, there may be an increased adhesive force between the dielectric line and the outer electrode line. All of these benefits are particularly useful for wire capacitors used at the semiconductor chip and package level, where scaling creates a desire for smaller and more effective electronic components, such as capacitors.

Moreover, the capacitor wire may be wire-bonded to a substrate. Therefore, the capacitor wire may be easily mounted on an electronic device, and in turn the electronic device may easily become highly integrated.

In conclusion, it may be possible to provide a capacitor wire capable of easily having reduced size, large capacitance, and high integration, and an electronic device including the capacitor wire.

The aforementioned description provides some embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A capacitor wire, comprising:
a core electrode line having a wire shape and extending in a length direction;
an outer electrode line that covers at least a portion of the core electrode line and extends in the length direction of the core electrode line; and
a dielectric line between the core electrode line and the outer electrode line, the dielectric line extending in the length direction of the core electrode line,
wherein the dielectric line has a porous structure including a plurality of holes,
wherein dielectric patterns fill the plurality of holes, and
wherein the dielectric patterns include a material different from a material of the dielectric line.

2. The capacitor wire of claim 1, wherein:
the dielectric line has a first surface adjacent to the outer electrode line and a second surface adjacent to the core electrode line, and
each of the plurality of holes extends into the dielectric line from the first surface toward the second surface.

3. The capacitor wire of claim 1, wherein
the dielectric line includes a first dielectric material, and the dielectric patterns include a second dielectric material whose permittivity is greater than a permittivity of the first dielectric material.

4. The capacitor wire of claim 1, wherein the dielectric line includes aluminum oxide.

5. The capacitor wire of claim 1, wherein the outer electrode line fills at least a portion of the plurality of holes.

6. The capacitor wire of claim 1, wherein:

the dielectric line surrounds an outer surface of the core electrode line, and the outer electrode line surrounds an outer surface of the dielectric line.

7. The capacitor wire of claim 6, wherein each of the plurality of holes extends into the dielectric line from the outer surface of the dielectric line.

8. The capacitor wire of claim 1, wherein:

the capacitor wire has a first end and a second end that are opposite to each other in the length direction of the core electrode line, and at the first end of the capacitor wire, the outer electrode line exposes an end of at least one selected from the core electrode line and the dielectric line.

9. The capacitor wire of claim 8, wherein:

the outer electrode line has a thickness measured from the dielectric line in a direction orthogonal to the length direction, and at the first end of the capacitor wire, a thickness of an end of the outer electrode line is greater than a thickness of another portion of the outer electrode line.

10. The capacitor wire of claim 9, wherein the outer electrode line includes a material whose melting point is less than a melting point of the core electrode line.

11. The capacitor wire of claim 8, further comprising an oxide layer, wherein, at the first end of the capacitor wire, the oxide layer covers an end of the dielectric line and contacts an end of the outer electrode line in the length direction of the core electrode line.

12. The capacitor wire of claim 11, wherein the oxide layer and the outer electrode line include the same metal element.

13. The capacitor wire of claim 8, wherein, at the first end of the capacitor wire, an end of the core electrode line has a spherical shape.

14. The capacitor wire of claim 8, wherein, at the first end of the capacitor wire, the dielectric line extends onto and covers an end of the core electrode line up to an end surface of the core electrode line perpendicular to the length direction of the core electrode line.

15. The capacitor wire of claim 1, wherein the dielectric line includes a first dielectric line adjacent to the core electrode line and a second dielectric line adjacent to the outer electrode line, wherein each of the first and second dielectric lines has the porous structure including the plurality of holes, and wherein the capacitor wire further comprises an inner electrode line between the first dielectric line and the second dielectric line, the inner electrode line extending in the length direction of the core electrode line.

16. A capacitor wire, comprising:

an innermost electrode line having a wire shape and extending in a length direction;

an outermost electrode line that surrounds at least a portion of the innermost electrode line and extends in the length direction of the innermost electrode line; and a dielectric line between the innermost electrode line and the outermost electrode line, the dielectric line extending in the length direction of the innermost electrode line, wherein the dielectric line has a porous structure including a plurality of holes, including boles separated from each other along a circumference of the dielectric line, when viewed from a direction parallel to a central axis of the innermost electrode line.

17. The capacitor wire of claim 16, wherein:

the dielectric line has a first surface adjacent to the outermost electrode line and a second surface adjacent to the innermost electrode line, and each of the plurality of holes extends into the dielectric line from the first surface toward the second surface.

18. The capacitor wire of claim 17, further comprising:

dielectric patterns that fill the plurality of holes, wherein the dielectric patterns include a material different from a material of the dielectric line.

19. The capacitor wire of claim 16, further comprising:

a middle electrode line between the innermost electrode line and outermost electrode line, wherein:

the innermost electrode line and outermost electrode line are electrically connected, and the middle electrode line is electrically separated from the innermost electrode line and the outermost electrode line by the dielectric line.

20. A capacitor wire, comprising:

a core electrode line having a wire shape and extending continuously to be elongated in a length direction to have a length along a central axis longer than a width perpendicular to the central axis;

an outer electrode line that covers at least a portion of the core electrode line and extends continuously to be elongated in the length direction of the core electrode line to have a length along the central axis longer than a width perpendicular to the central axis; and a dielectric line between the core electrode line and the outer electrode line, the dielectric line extending continuously to be elongated in the length direction of the core electrode line to have a length along the central axis longer than a width perpendicular to the central axis, wherein the dielectric line has a porous structure including a plurality of pores.

* * * * *